(12) United States Patent
Sharon et al.

(10) Patent No.: US 10,715,178 B2
(45) Date of Patent: Jul. 14, 2020

(54) GENERALIZED LOW-DENSITY PARITY-CHECK CODES

(71) Applicant: Western Digital Technologies, Inc., San Jose, CA (US)

(72) Inventors: Eran Sharon, Rishon Lezion (IL); Ran Zamir, Ramat Gan (IL); David Avraham, Even-Yehuda (IL)

(73) Assignee: Western Digital Technologies, Inc., San Jose, CA (US)

( * ) Notice: Subject to any disclaimer, the term of this patent is extended or adjusted under 35 U.S.C. 154(b) by 6 days.

(21) Appl. No.: 16/367,140

(22) Filed: Mar. 27, 2019

(65) Prior Publication Data

US 2020/0099395 A1 Mar. 26, 2020

Related U.S. Application Data

(60) Provisional application No. 62/736,203, filed on Sep. 25, 2018.

(51) Int. Cl.
*H03M 13/11* (2006.01)
*G06F 11/10* (2006.01)

(52) U.S. Cl.
CPC ..... *H03M 13/1105* (2013.01); *G06F 11/1076* (2013.01); *H03M 13/1148* (2013.01)

(58) Field of Classification Search
None
See application file for complete search history.

(56) References Cited

U.S. PATENT DOCUMENTS 3,697,929 A * 10/1972 Konewko ............... H01R 12/88
439/260
7,251,769 B2 7/2007 Ashikhmin et al.
(Continued)

FOREIGN PATENT DOCUMENTS

EP 2 675 069 A1 12/2013

OTHER PUBLICATIONS

Djordjevic, Ivan B., "Generalized LDPC Codes and Turbo-Product Codes with Reed-Muller Component Codes," TELSIKS 2007, pp. 127-134 (Sep. 26-28, 2007).
(Continued)

*Primary Examiner* — Phung M Chung
(74) *Attorney, Agent, or Firm* — Vierra Magen Marcus LLP

(57) ABSTRACT

Technology is described herein for a generalized low-density parity-check (GLDPC) decoder. A GLDPC decoder comprises an LDPC decoder and a syndrome decoder. The LDPC decoder is configured to generate a codeword for encoded data. The syndrome decoder is configured to decode a syndrome of punctured check nodes based on a linear block code having more than one information bit. The GLDPC decoder is configured to control the LDPC decoder to compute an initial value of the syndrome of the punctured check nodes based on an initial estimate of the codeword from the LDPC decoder. The GLDPC decoder is configured to alternate between controlling the syndrome decoder to correct the syndrome and controlling the LDPC decoder to update the codeword based on the corrected syndrome. The GLDPC decoder is configured to provide a decoded version of the encoded data based on a final estimate of the codeword.

20 Claims, 15 Drawing Sheets

(56) References Cited

U.S. PATENT DOCUMENTS

| | | | |
|---|---|---|---|
| 8,386,879 | B2 | 2/2013 | Djordjevic et al. |
| 8,929,009 | B2* | 1/2015 | Yang .................. H03M 13/1111 360/39 |
| 9,473,173 | B2* | 10/2016 | Yen ..................... H03M 13/1105 |
| 9,722,634 | B2 | 8/2017 | Djordjevic et al. |
| 2011/0239083 | A1* | 9/2011 | Kanno .................. G11C 29/52 714/756 |
| 2017/0063400 | A1* | 3/2017 | Zhang ................. G06F 11/1012 |

OTHER PUBLICATIONS

Benedetto, S., et al., "Serial Concatenation of Interleaved Codes: Performance Analysis, Design, and Iterative Decoding," TDA Progress Report 42-126, pp. 1-26 (Aug. 15, 1996).

Min, Y., et al., "A Class of Doubly-Generalized LDPC Codes," The 2013 International Conference on Advanced Technologies for Communications (ATC' 13), pp. 1-5.

Wang, et al., "Doubly Generalized LDPC Codes" ISIT 2006 (Seattle, USA, Jul. 9-14, 2006), Dept. of Elect. Eng., University of Hawaii at Manoa, Honolulu, HI, pp. 669-673.

Yu, et al., "Hamming-GLDPC Codes in BEC and AWGN Channels," ICWMMN2015 Proceedings, School of Electr. and Inform. Eng., Beijing Jiaotong University, Beijing, China, pp. 103-106.

* cited by examiner

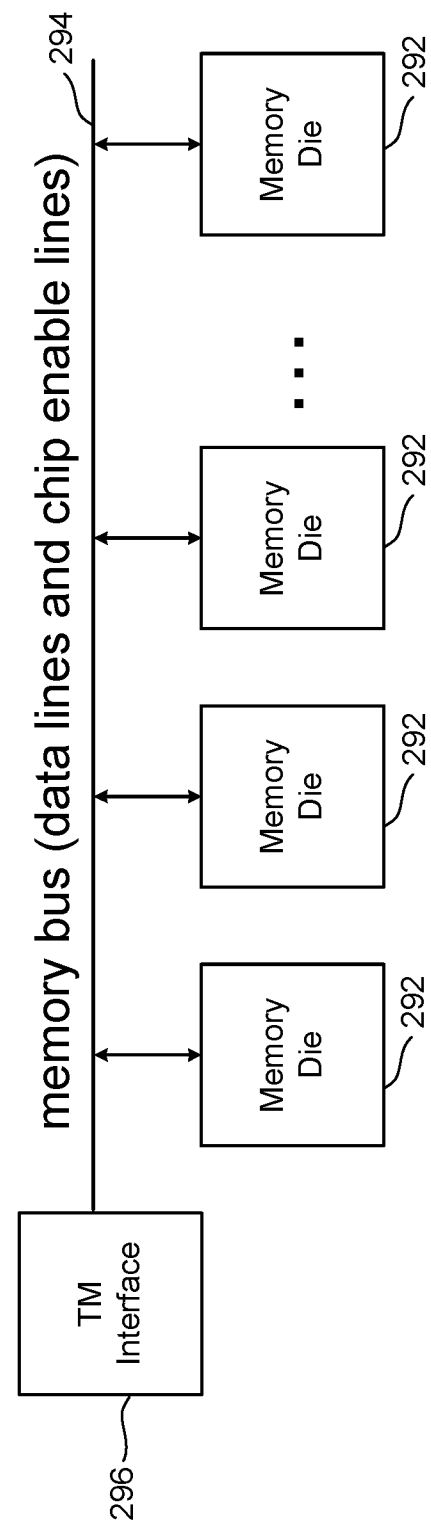

US 10,715,178 B2

GENERALIZED LOW-DENSITY PARITY-CHECK CODES

CLAIM OF PRIORITY

The present application claims priority from U.S. Provisional Patent Application No. 62/736,203, entitled "GENERALIZED LOW-DENSITY PARITY-CHECK CODES," by Sharon et al., filed Sep. 25, 2018, incorporated by reference herein in its entirety.

BACKGROUND

The present technology relates to low-density parity-check codes.

Error Correction Coding (ECC) technology is a key enabler for high-density storage, allowing reliable storage over increasingly unreliable media due to memory process scaling. The race for improved memory cost efficiency and performance fuels the search for efficient ECC solutions, maximizing the correction capability for a given overprovisioning, while having low complexity and low power encoding and decoding methods. Today's state of the art ECC solutions used in storage applications are based on Low Density Parity Check (LDPC) codes.

BRIEF DESCRIPTION OF THE DRAWINGS

FIG. 4 is a block diagram of one embodiment of a memory package.

DETAILED DESCRIPTION

The present technology pertains to generalized low-density parity-check codes. Error Correction Coding (ECC) technology is a key enabler for high-density storage, allowing reliable storage over increasingly unreliable media due to memory process scaling. The race for improved memory cost efficiency and performance fuels the search for efficient ECC solutions, maximizing the correction capability for a given overprovisioning, while having low complexity and low power encoding and decoding methods. Today's state of the art ECC solutions used in storage applications are based on Low Density Parity Check (LDPC) codes.

Generalized LDPC (GLDPC) codes, including corresponding efficient low complexity encoding and decoding solutions are disclosed herein. A GLDPC code is not necessarily limited to repetition codes and parity check codes, as an LDPC might be. A GLDPC may have other constituent codes as graph nodes such as Hamming codes, extended Hamming codes, Simplex codes, or Reed Muller codes. A GLDPC may be described by a sparse bipartite graph, with general constituent codes imposing its nodes' constraints. The general constituent code is a linear block code having more than one information bit, in one embodiment. The bipartite graph for a GLDPC code has at least one variable node for which the constituent code is a linear block code having more than one information bit, in one embodiment.

In some embodiments, the general constituent code is at a punctured variable node in the sparse bipartite graph, which may be referred to as a punctured GLDPC node. Punctured GLDPC nodes allow additional degrees of freedom when designing the code. Therefore, punctured GLDPC nodes allow a more efficient code to be designed. Embodiments of GLDPC decoders based on a punctured GLDPC node have lower bit error rates that LDPC decoders while maintaining the same code rate as the LDPC decoder. The extra degrees of freedom that exist in embodiments of GLDPC codes enable them to outperform LDPC codes having the same code rate.

One embodiment disclosed herein includes an apparatus comprising a generalized low-density parity-check (GLDPC) encoder/decoder configured to encode and decode data using a generalized low-density parity-check code. The GLDPC encoder/decoder is used to encode data to be stored in non-volatile memory (e.g., NAND, NOR, ReRAM, phase change memory (PCM)), in one embodiment, in one embodiment. The GLDPC encoder/decoder is used to decode the encoded data that was stored in the non-volatile memory, in one embodiment.

Technology described herein may be used with a variety of types of memory systems. However, it will be appreciated that technology described herein is not limited to memory systems.

Figure 1:
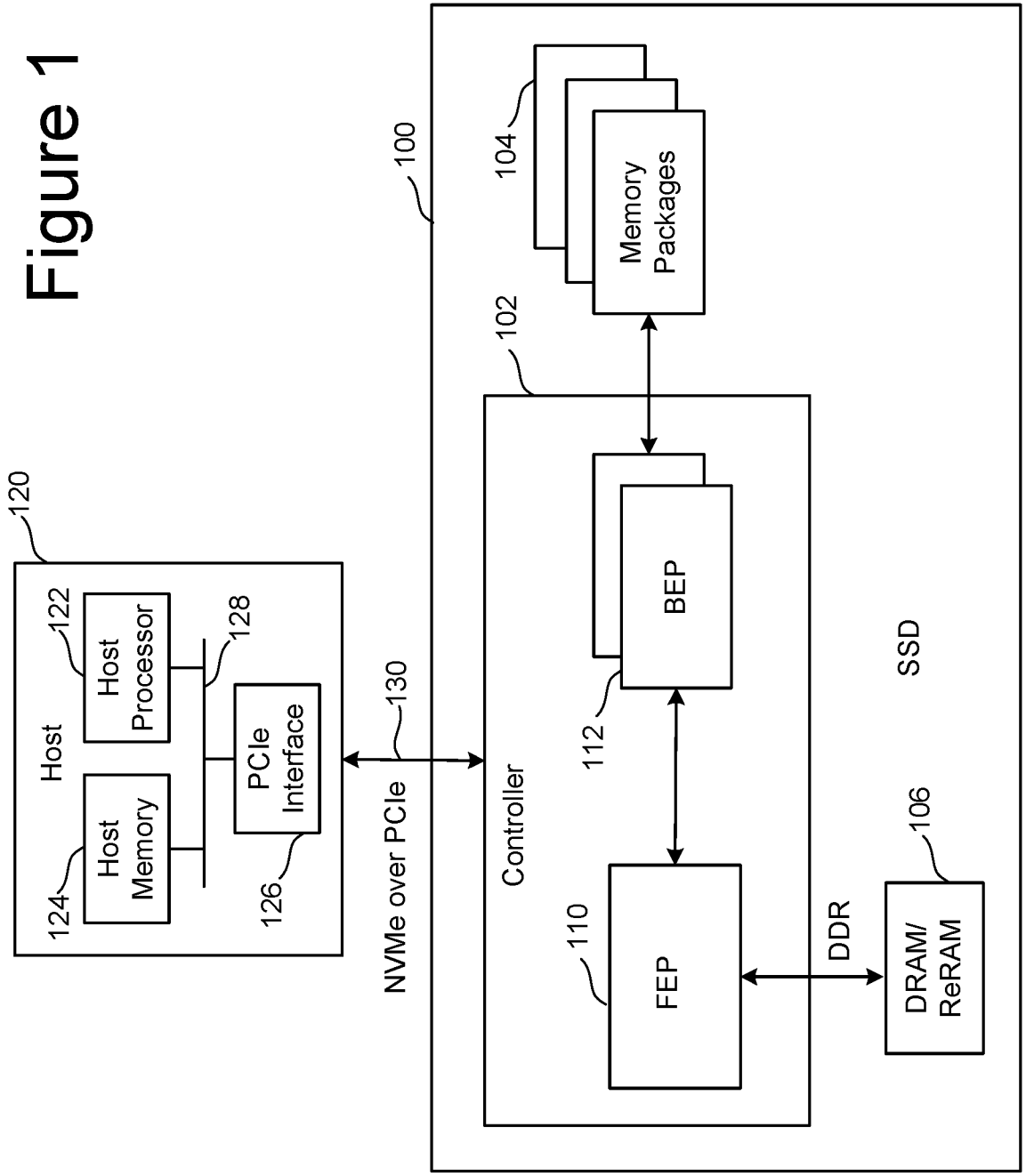
FIG. 1 is a block diagram of one embodiment of a memory system connected to a host.

FIG. 1 is a block diagram of one embodiment of a memory system 100 connected to a host 120. The host may also be referred to as a host system. Memory system 100 can implement the technology proposed herein. Many different types of memory systems can be used with the technology proposed herein. One example memory system is a solid state drive ("SSD"). Memory system comprises a Controller 102, non-volatile memory 104 for storing data, and local memory (e.g. DRAM/ReRAM) 106. Controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the Controller 102 is manufactured as a System on a Chip ("SoC"). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory 104 comprises a plurality of memory packages. Each memory package includes one or more memory die. Therefore, Controller 102 is connected to one or more non-volatile memory die. In one embodiment, each memory die in the memory packages utilize NAND flash memory (including two dimensional NAND flash memory and/or three dimensional NAND flash memory). In other embodiments, the memory package can include other types of memory.

Controller 102 communicates with host 120 via an interface 130 that implements NVM Express (NVMe) over PCI Express (PCIe). For working with memory system 100, host 120 includes a host processor 122, host memory 124, and a PCIe interface 126 connected to bus 128. Host memory 124 is the host's physical memory, and can be DRAM, SRAM, non-volatile memory or another type of storage. Host 120 is external to and separate from memory system 100 (e.g., an SSD). In one embodiment, memory system 100 is embedded in host 120.

As will be described in more detail below, Controller 102 includes a command log configured to store a copy of a sequence of commands received from host 120 and executed by the Controller 102. Controller 102 also includes a means for replaying the sequence of commands after they have been executed by reading the commands from the command log, writing the commands read to a memory on host 120, and executing (at Controller 102) the commands from memory 124 on host 120.

Figure 2:
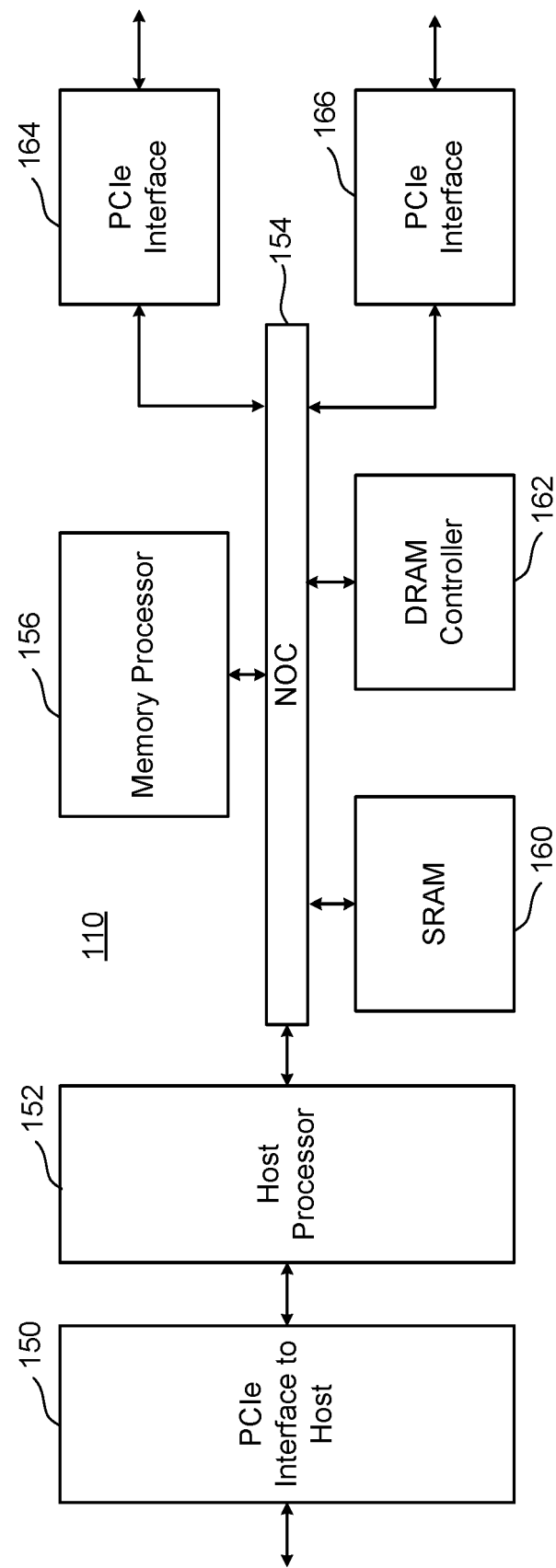
FIG. 2 is a block diagram of one embodiment of a Front End Processor Circuit.

FIG. 2 is a block diagram of one embodiment of FEP circuit 110. FIG. 2 shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 2, the SSD controller will include two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

Figure 3A:
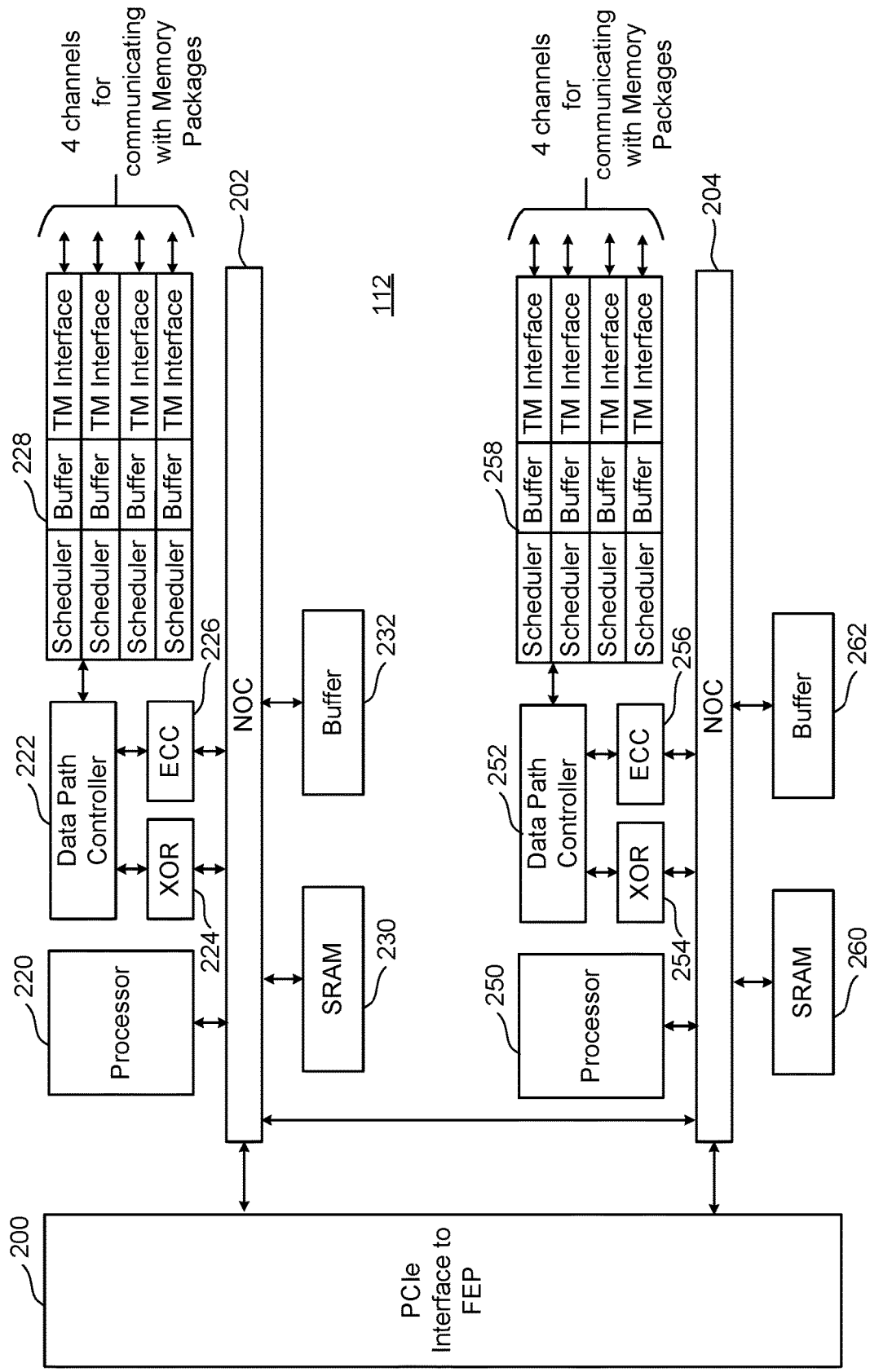
FIG. 3A is a block diagram of one embodiment of a Back End Processor Circuit.

FIG. 3A is a block diagram of one embodiment of the BEP circuit 112. FIG. 3A shows a PCIe Interface 200 for communicating with the FEP circuit 110(e.g., communicating with one of PCIe Interfaces 164 and 166 of FIG. 2). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction. The XOR engines 224/254 are used to XOR the data so that data can be combined and stored in a manner that can be recovered in case there is a programming error. Data path controller 22 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 3B:
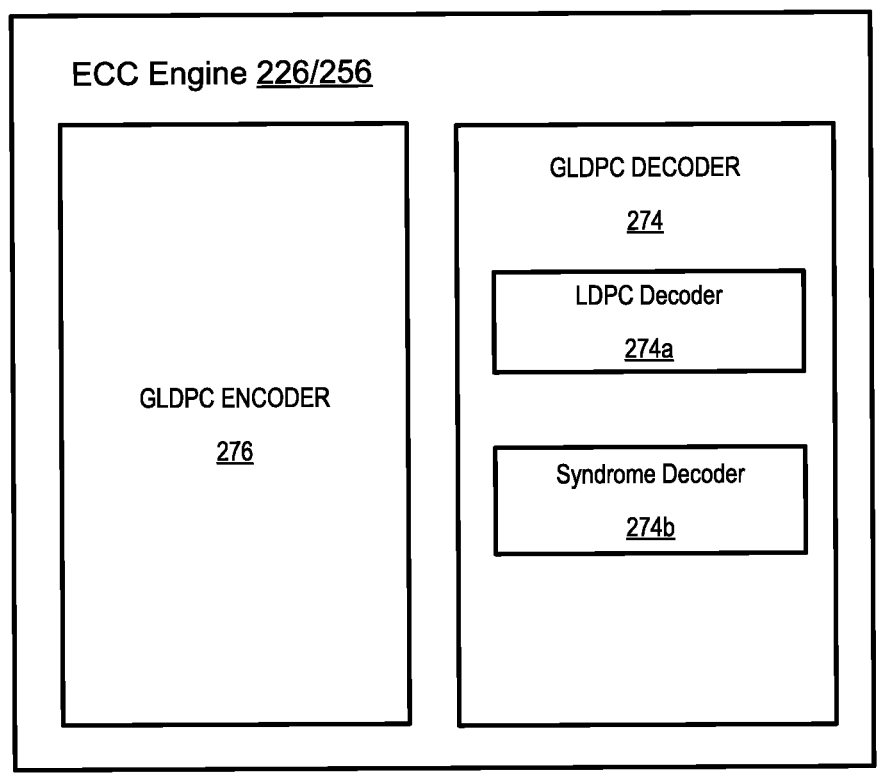
FIG. 3B is a block diagram of one embodiment of an ECC engine.

FIG. 3B depicts further details of one embodiment of ECC engines 226/256. The error correction controller (ECC) engine 226/256 encodes the data bytes received from the host, and decodes and error corrects the data bytes read from the non-volatile memory. The ECC engine 226/256 has a generalized low-density parity-check (GLDPC) encoder 276 and a GLDPC decoder 274. In one embodiment, the GLDPC decoder 274 includes a low-density parity check (LDPC) decoder 274a and a syndrome decoder 274b. An output of the GLDPC decoder 274 may be provided to the host.

The GLDPC encoder 276 is configured to encode data using a generalized low-density parity-check code. The GLDPC encoder 276 is used to encode data to be stored in non-volatile memory (e.g., NAND, NOR, ReRAM, phase change memory (PCM)), in one embodiment. The GLDPC decoder 274 is configured to decode data that was stored after encoding with the GLDPC encoder 276. In one embodiment, the GLDPC decoder 274 comprises an LDPC decoder 274a and a syndrome decoder 274b.

Some embodiments of the GLDPC encoder 276 and GLDPC decoder 274 are based on a sparse bipartite graph having variable nodes and check nodes. The check nodes are referred to as parity check nodes, in some embodiments, but can also represent general constraints imposed by a general constituent code. The sparse bipartite graph has edges between variable nodes and check nodes, which are used for passing messages passed between the variable nodes and check nodes, in one embodiment. The decoders 274 may pass messages between the variable nodes and the check nodes, in accordance with the edges in the sparse bipartite graph. Passing a message between a variable node and a check node is accomplished by performing a message passing computation, in some embodiments. The message passing computation is based on belief propagation, in one embodiment.

The nodes in the bipartite graph include non-punctured check nodes and punctured check nodes, in one embodiment. A punctured check node is a check node that is connected by an edge in the sparse bipartite graph with a punctured variable node, in one embodiment. Thus, messages are passed between punctured variable nodes and punctured check nodes, in one embodiment. A non-punctured check node is a check node that is not connected by an edge in the sparse bipartite graph with any punctured variable nodes, in one embodiment. Thus, a non-punctured check node does not exchange a message with a punctured variable node, in one embodiment.

The bits corresponding to non-punctured variable nodes are stored in non-volatile memory, in one embodiment. For example, data for non-punctured variable nodes are transferred from BEP 112 to memory packages 104 and stored in non-volatile memory in the memory packages 104, in one embodiment. The bit or bits for a punctured variable node is not transferred from BEP 112 to memory packages 104, in one embodiment. Thus, the bit or bits for a punctured variable node are not stored in memory packages 104, in one embodiment. Note that there are more than one information bits for a punctured variable node, in some embodiments.

The syndrome decoder 274b is configured to decode a syndrome for punctured check nodes, in one embodiment. In general, a syndrome may be calculated based on a product of a sparse parity check matrix (H) and a codeword, in one embodiment. The syndrome decoder 274b may decode the syndrome based on a portion (e.g., rows) of a sparse parity check matrix (H) that corresponds to punctured check nodes.

The punctured check nodes correspond to one or more punctured variable nodes. For example, a punctured variable node is connected by an edge to punctured check nodes. The punctured variable nodes are based on a linear block code having more than one information bit, in some embodiments. A linear block code having more than one information bit may be referred to as a "non-trivial linear block code." The linear block code may be a non-repeating linear block code. The syndrome decoder 274b is referred to as a non-repeating linear block code decoder, in one embodiment. Examples of linear block codes having more than one information bit include, but are not limited to, a Simplex code, a Hamming code, an extended Hamming (or "eHamming") code, and a first order Reed Muller code. The syndrome decoder 274b comprises a Hamming decoder, in one embodiment. The syndrome decoder 274b comprises an extended Hamming (or "eHamming") decoder, in one embodiment. The syndrome decoder 274b comprises a Simplex decoder, in one embodiment. The syndrome decoder 274b comprises a Reed-Muller decoder, in one embodiment. The syndrome decoder 274b comprises a first order Reed-Muller decoder, in one embodiment.

The GLDPC encoder 276 comprises a Hamming encoder, in one embodiment. The GLDPC encoder 276 comprises an extended Hamming (or "eHamming") encoder, in one embodiment. The GLDPC encoder 276 comprises a Simplex encoder, in one embodiment. The GLDPC encoder 276 comprises a Reed-Muller encoder, in one embodiment. The GLDPC encoder 276 comprises a first order Reed-Muller encoder, in one embodiment. The Hamming encoder, eHamming, Simplex encoder, Reed-Muller encoder may be referred to as constituent code encoders. The GLDPC encoder 276 may comprise other elements than a constituent code encoder.

Note the ECC engine of FIG. 3B is not limited for use in a memory system 100. More generally, the GLDPC encoder 276 may be used to encode data to be transmitted over any communication channel. More generally, the GLDPC decoder 274 may be used to decode data that is received over any communication channel. Thus, it is not required that the encoded data be stored in a memory package 104.

FIG. 4 is a block diagram of one embodiment of a memory package 104 that includes a plurality of memory die 292 connected to a memory bus (data lines and chip enable lines) 294. The memory bus 294 connects to a Toggle Mode Interface 296 for communicating with the TM Interface of a BEP circuit 112 (see e.g. FIG. 3). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

Figure 5:
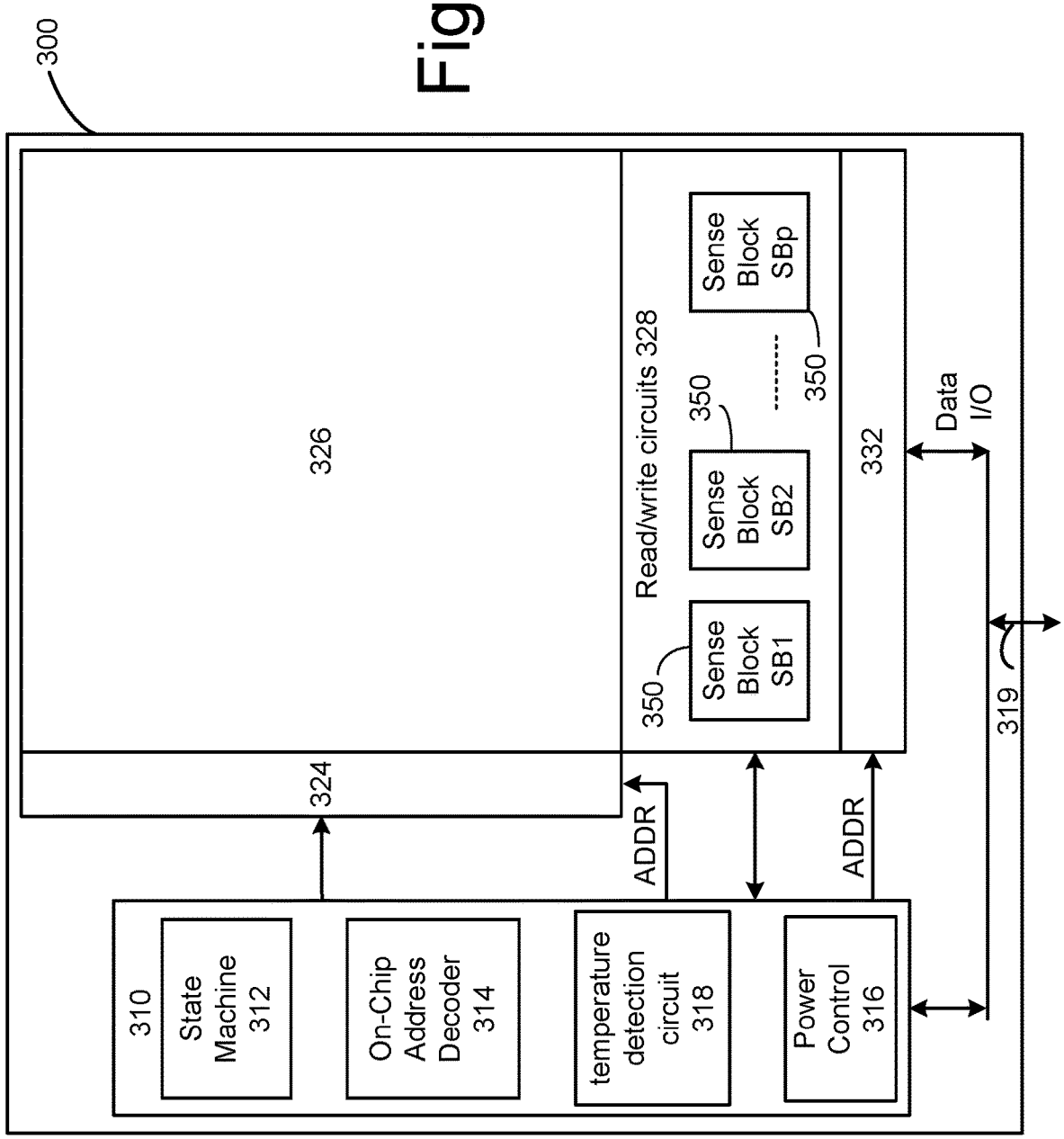
FIG. 5 is a functional block diagram of one embodiment of a memory die.

FIG. 5 is a functional block diagram of one embodiment of a memory die 300. The components depicted in FIG. 5 are electrical circuits. In one embodiment, each memory die 300 includes a memory structure 326, control circuitry 310, and read/write circuits 328. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page of memory cells to be read or programmed in parallel. Commands and data are transferred between the Controller and the memory die 300 via lines 319. In one embodiment, memory die 300 includes a set of input and/or output (I/O) pins that connect to lines 319.

Control circuitry 310 cooperates with the read/write circuits 328 to perform memory operations (e.g., write, read, and others) on memory structure 326, and includes a state machine 312, an on-chip address decoder 314, a power control circuit 316 and a temperature detection circuit 318. State machine 312 provides die-level control of memory operations. In one embodiment, state machine 312 is programmable by software. In other embodiments, state machine 312 does not use software and is completely implemented in hardware (e.g., electrical circuits). In one embodiment, control circuitry 310 includes buffers such as registers, ROM fuses and other storage devices for storing default values such as base voltages and other parameters.

The on-chip address decoder 314 provides an address interface between addresses used by Controller 102 to the hardware address used by the decoders 324 and 332. Power control module 316 controls the power and voltages supplied to the word lines and bit lines during memory operations. Power control module 316 may include charge pumps for creating voltages. The sense blocks include bit line drivers.

In one embodiment, memory structure 326 comprises a three dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

As discussed above, in one embodiment the interface 130 between the memory system 100 and the host 120 is NVMe over PCIe. NVMe is an interface that allows host software to communicate with a non-volatile memory system. This interface is optimized for Enterprise and Client solid state drives, typically attached as a register level interface to the PCIe interface. The register interface and command set are specified apart from any usage model for the non-volatile memory system, but rather only specifies the communication interface to the non-volatile memory system. Thus, this specification does not specify whether the non-volatile memory system is used as a solid state drive, a main memory, a cache memory, a backup memory, a redundant memory, etc. (any of which can be implemented for system 100).

Figure 6:
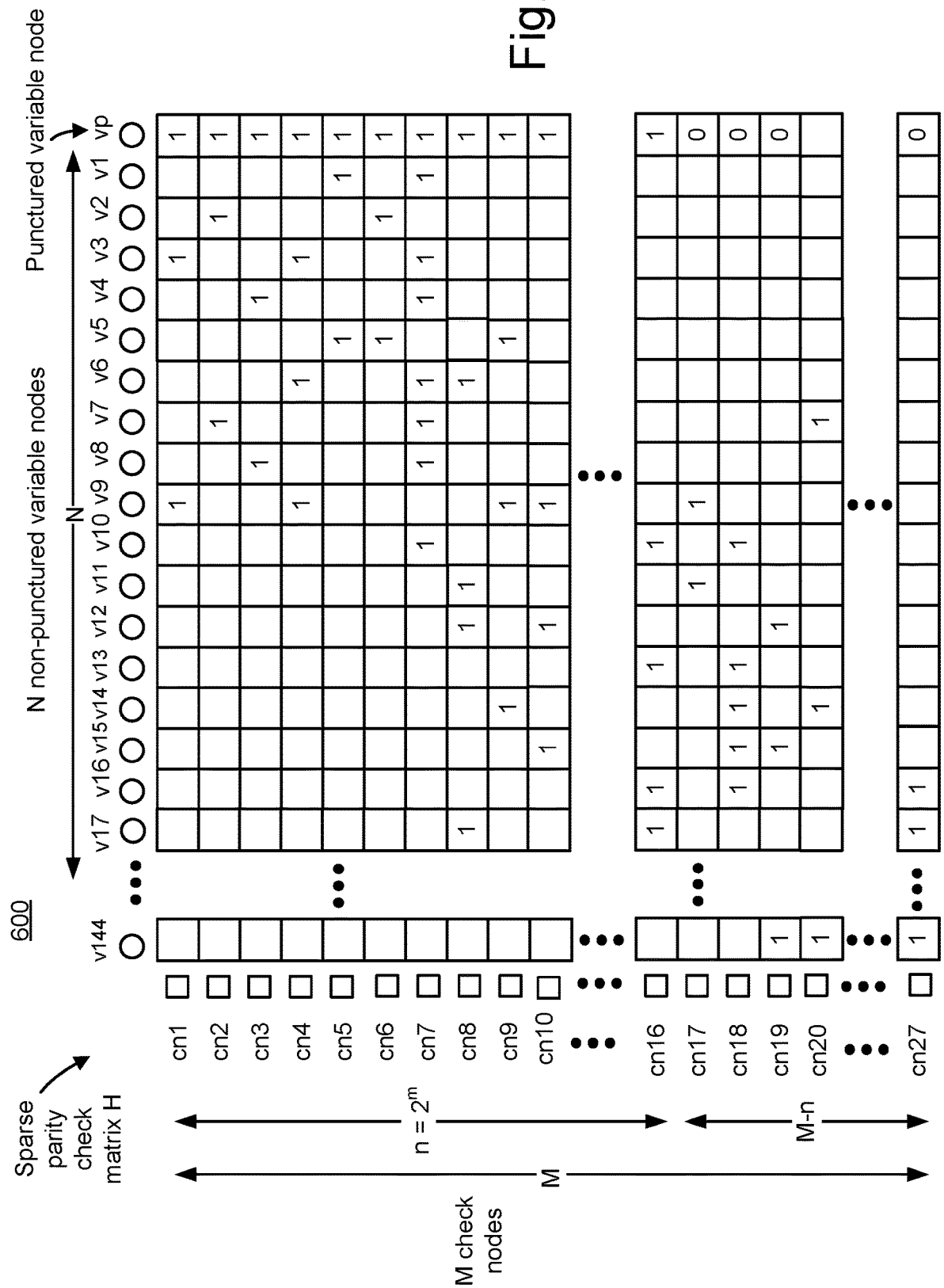
FIG. 6 depicts one embodiment of a sparse parity check matrix H.

In some embodiments, the GLDPC decoder 274 is based on a sparse parity check matrix (which can also be represented as a sparse bipartite graph). FIG. 6 depicts one embodiment of a sparse parity check matrix H. The matrix 600 includes M rows and K+M columns, which are in correspondence with K information bits and M parity bits in each codeword of length N=K+M. Further, the parity bits are defined such that M parity check equations are satisfied, where each row of the matrix represents a parity check equation.

Each column corresponds to a variable node in a sparse bipartite graph, in one embodiment. In this example, there are N non-punctured variable nodes (v1-v144) and one punctured variable node ("vp"). Not all variable nodes are depicted in FIG. 6. There could be more or fewer than 144 variable nodes. Each row corresponds to a check node (cn1-cn27) in a sparse bipartite graph, in one embodiment. Not all check nodes are depicted in FIG. 6. There could be more or fewer than 27 check nodes. The check nodes are divided into a set of 16 punctured check nodes and a set of 11 non-punctured check nodes, which will be described more fully below. There may be more or fewer than 16 punctured check nodes. There may be more or fewer than 11 non-punctured check nodes. In some embodiments, the number of punctured check nodes is a power of two. In other embodiments n is not a power of 2.

Figure 7:
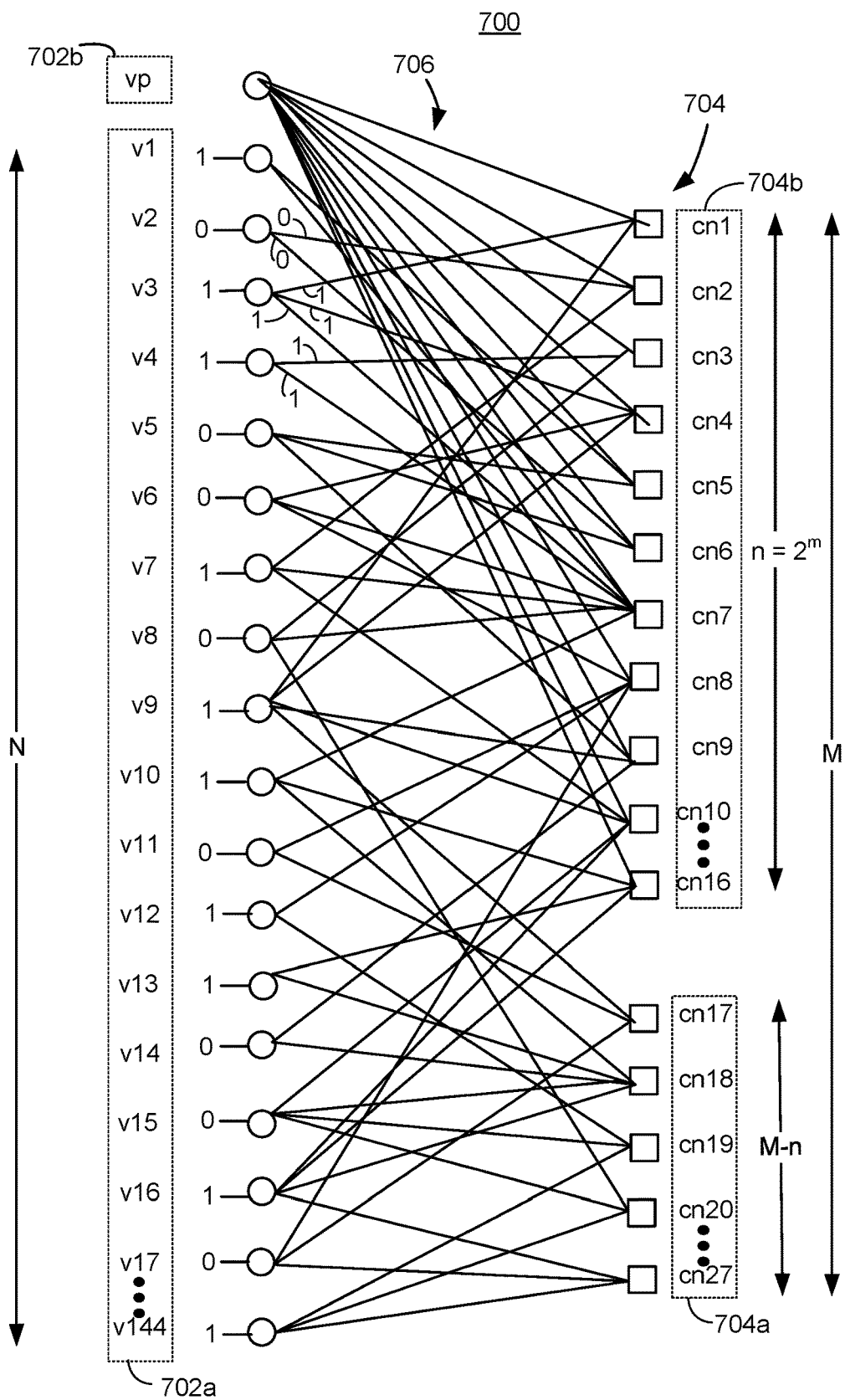
FIG. 7 depicts one embodiment of a sparse bipartite graph that corresponds to the sparse parity check matrix in FIG. 6.

FIG. 7 depicts one embodiment of a sparse bipartite graph 700 that corresponds to the sparse parity check matrix in FIG. 6. The sparse bipartite graph G=(V,C,E) has a set V of N+1 variable nodes 702 (N=144 in this example), a set C of M check nodes 704 (M=27 in this example) and a set E of edges 706 (62 edges are depicted in FIG. 7) connecting variable nodes 702 to check nodes 704. Not all variable nodes are depicted in FIG. 7. Not all check nodes are depicted in FIG. 7. The variable nodes correspond to the codeword bits and the check nodes correspond to parity-check constraints on the bits. A variable node 702 is connected by edges 706 to the check nodes 704 it participates in. Note that in some embodiments "lifting" is performed on the bipartite graph. A common construction is to perform "lifting" with cyclic shifts in order to generate Quasi-Cyclic (QC) LDPC or GLDPC codes, for which efficient high throughput decoders can be designed (as the computations are more easily parallelized for QC-LDPC/GLDPC codes). Those of ordinary skill in the art understand "lifting" of graphs.

The sparse bipartite graph 700 has N non-punctured variable nodes 702a and one punctured variable node 702b in this example. A non-punctured variable node corresponds to a bit of the codeword that is stored in the memory structure 326, in one embodiment. A punctured variable node corresponds to one or more bits in the codeword that are not stored in the memory 326, in one embodiment. Note that there may be more than one bit associated with the punctured variable node 702b. Also, there could be more than one punctured variable node 702b.

There are a total of M check nodes 704, including "n" punctured check nodes 704b and "M-n" non-punctured check nodes 704a. As explained above, a punctured check node 704b is connected by an edge 706 to a punctured variable node 702b. As explained above, a non-punctured check node 704a does not have any edge connections to a punctured variable node 702b. Note that not all of the "n" punctured check nodes 704b are depicted in FIG. 7. Likewise, not all of the "M-n" non-punctured check nodes 704a are depicted in FIG. 7. In some embodiments, the number of punctured check nodes is a power of two. In one embodiment, n is 16. In some embodiments, there may be more or fewer than 16 punctured check nodes 704b. In some embodiments, there may be more or fewer than 11 non-punctured check nodes 704a.

The non-punctured variable nodes 702a are based on repetition codes, in one embodiment. The repetition code is a trivial linear block code, in some embodiments. As those of ordinary skill in the art understand, a repetition code is a code that is repeated. The edges 706 connected to three of the non-punctured variable nodes 702a are labeled to demonstrate the concept of a repetition code. In particular the edges connected to non-punctured variable nodes v2, v3, and v4 are labeled to demonstrate the concept of a repetition code. The edges connected to the other non-punctured variable nodes 702a are not labeled so as to not obscure the diagram. FIG. 7 depicts a value next to each non-punctured variable node 702a to indicate that the encoded data contains a value for the non-punctured variable nodes 702a.

The constituent code for a punctured variable node 702b is a non-trivial linear block code, in one embodiment. As noted above, a non-trivial linear block code contains more than one information bit. Hence, the constituent code for a punctured variable node 702b is not repetition code. The constituent code for the non-trivial linear block code may also be referred to as a generalized constituent code. FIG. 7 does not depict a value for the punctured variable node 702b to indicate that since this is a punctured variable node, the encoded data does not contain a value for the punctured variable node 702b. Examples of codes upon which the punctured variable node 702b may be based include, but are not limited to, Simplex, Hamming, eHamming, and first order Reed Muller. Note that such codes may have more than one bit. Thus, note that there may be more than one bit associated with the punctured variable node 702b. In the example of FIG. 7, the punctured variable node 702b may represent 11 information bits. In one embodiment, there are 11 information bits and five parity bits associated with the punctured variable node 702b. The edges 706 connected to the punctured variable node 702b satisfy a constraint for the generalized constituent code. For example, the edges 706 connected to the punctured variable node 702b satisfy a constraint for an eHamming code, in one embodiment.

During decoding, one embodiment of the GLDPC decoder 274 attempts to satisfy the parity checks. In this example, there are twenty-seven parity checks, as indicated by the check nodes cn1 through cn27. The twenty-seventh parity check at cn27 determines if $v16 \oplus v17 \oplus v144=0$, where "$\oplus$" denotes the exclusive-or (XOR) logical operation. This check is satisfied if there is an even number of "1" in bits corresponding to variable nodes v16, v17, and v144. This check is denoted by the fact that arrows from variable nodes v16, v17, and v144 are connected to check node cn27 in the bi-partite graph. In one embodiment, initially LDPC decoder 274a determines whether non-punctured variable nodes 702a satisfy the constraints of the non-punctured check nodes 704a. In other words, initially LDPC decoder 274a does not use the punctured check nodes 704b because the value for the punctured variable node 702b is initially unknown. After a value for the punctured variable node 702b is estimated, the LDPC decoder 274a may determine whether the variable nodes 702 satisfy the constraints of the check nodes 704, in one embodiment.

The punctured variable node 702b should be a valid code of the generalized constituent code, in one embodiment. For example, if the punctured variable node 702b is based on an eHamming code, then the punctured variable node 702b should be a valid eHamming code. During decoding, checks are made based on the punctured check nodes 704b to verify whether the value of the punctured variable node 702b meets constraints imposed by the punctured check nodes 704b, in one embodiment. In one embodiment, the syndrome decoder 274b determines whether the punctured variable node 702b satisfies the constraints of the punctured check nodes 704b.

In one embodiment, the GLDPC decoder 274 uses an iterative probabilistic decoding process involving iterative message passing decoding algorithms. These algorithms operate by exchanging messages between variable nodes and check nodes over the edges of the underlying bipartite graph representing the code.

The GLDPC decoder 274 may be provided with initial estimates of the codeword bits (based on the communication channel output or based on the read content from the memory array). These initial estimates may be refined and improved by imposing the parity-check constraints that the bits should satisfy as a valid codeword. This may be done by exchanging information between the variable nodes representing the codeword bits and the check nodes representing parity-check constraints on the codeword bits, using the messages that are passed along the graph edges.

For example, the iterating can involve serially traversing the check nodes and updating the LLR values of the bits involved based on each parity check. In one approach, an attempt is made to satisfy the first parity check of cn1. Once that parity check is satisfied, an attempt is made to satisfy the cn2 parity check and so forth. The LLR values are adjusted, if necessary, in each iteration, in a manner known to those skilled in the art.

Specifically, in iterative decoding algorithms, it is common to utilize "soft" bit estimations, which convey both the bit estimation and the reliability of the estimation.

The bit estimations conveyed by the messages passed along the graph edges can be expressed in various forms. A common measure for expressing "soft" bit estimation is the Log-Likelihood Ratio (LLRs), defined as follows:

$$LLR = \log \frac{Pr(v = 0 \mid \text{current constraints and observations})}{Pr(v = 1 \mid \text{current constraints and observations})} \quad \text{(Eq. 1)}$$

where the "current constraints and observations" are the various parity-check constraints taken into account in computing the message at hand and the observations corresponding to the bits participating in these parity checks. Without loss of generality, we assume that LLR messages are used throughout the rest of this document. The sign of the LLR typically provides the bit estimation (i.e. positive LLR corresponds to v=0 and negative LLR corresponds to v=1). The magnitude of the LLR provides the reliability of the estimation (i.e. |LLR|=0 means that the estimation is completely unreliable and |LLR|=∞ means that the estimation is completely reliable and the bit value is known).

Usually, the messages passed during the decoding along the graph edges between variable nodes and check nodes are extrinsic. An extrinsic message 'm' passed from a variable node 'v' on edge 'e' may take into account all the values received on edges connected to variable node 'v' other than edge 'e' (this is why it is called extrinsic—since it is based only on new information).

An example of a message passing decoding algorithm is a Belief-Propagation (BP) algorithm. Let $$P_v = \log \frac{Pr(v = 0 \mid y)}{Pr(v = 1 \mid y)} \quad \text{(Eq. 2)}$$

denote the initial decoder estimation for bit v, based only on the received or read symbol 'y'. Note that it is also possible that some of the bits are not transmitted through the communication channel or stored in the memory array, hence there is no 'y' observation for these bits. In this case, there are two possibilities: 1) shortened code, e.g., the bits are known a priori and $P_v = \pm\infty$ (depending on whether the bit is 0 or 1), and 2) punctured bits—the bits are unknown a priori and $$P_v = \log \frac{Pr(v = 0)}{Pr(v = 1)} \quad \text{(Eq. 3)}$$

where Pr(v=0) and Pr(v=1) are the a priori probabilities that the bit v is 0 or 1 respectively. In the contents of flash memory, punctured bits are simply not stored in the memory array. Assuming the information bits have equal a priori probabilities to be 0 or 1 and assuming the code is linear, then:

$$P_v = \log \frac{1/2}{1/2} = 0 \quad \text{(Eq. 4)}$$

Let $$Q_v = \log \frac{Pr(v = 0 \mid \underline{y}, H \cdot \underline{v} = 0)}{Pr(v = 1 \mid \underline{y}, H \cdot \underline{v} = 0)} \quad \text{(Eq. 5)}$$

denote the final decoder estimation for bit 'v', based on the entire received or read sequence 'y' and assuming that bit 'v' is part of a codeword (i.e. assuming H·v=0).

Let $Q_{vc}$ and $R_{cv}$ denote a message from variable node 'v' to check node 'c' and a message from check node 'c' to variable node 'v', respectively. A BP algorithm utilizes the following update rules for computing the messages. A variable node to check node computation rule is:

$$Q_{vc}^j = P_v + \sum_{c' \in N(v) \backslash c} R_{c'v}^j \quad \text{(Eq. 6)}$$

Here N(v) denotes the set of neighbors of a node 'v' in the graph G and N(v)\c refers to the neighbors excluding node 'c'. Here, "j" refers to the iteration. A check node to variable node computation rule in a BP algorithm is:

$$R_{cv}^{j+1} = 2 \cdot \tanh^{-1}\left(\prod_{v' \in N(c) \backslash v} \tanh\left(\frac{Q_{v'c}^j}{2}\right)\right) \quad \text{(Eq. 7)}$$

In a similar manner, N(c), denotes the set of variable node neighbors of a check node 'c' in the graph G and N(c)\v refers to the neighbors excluding node 'v'. A final decoder estimation for bit 'v' is:

$$Q_v^j = P_v + \sum_{c' \in N(v)} R_{c'v}^j \quad \text{(Eq. 8)}$$

Figure 8:
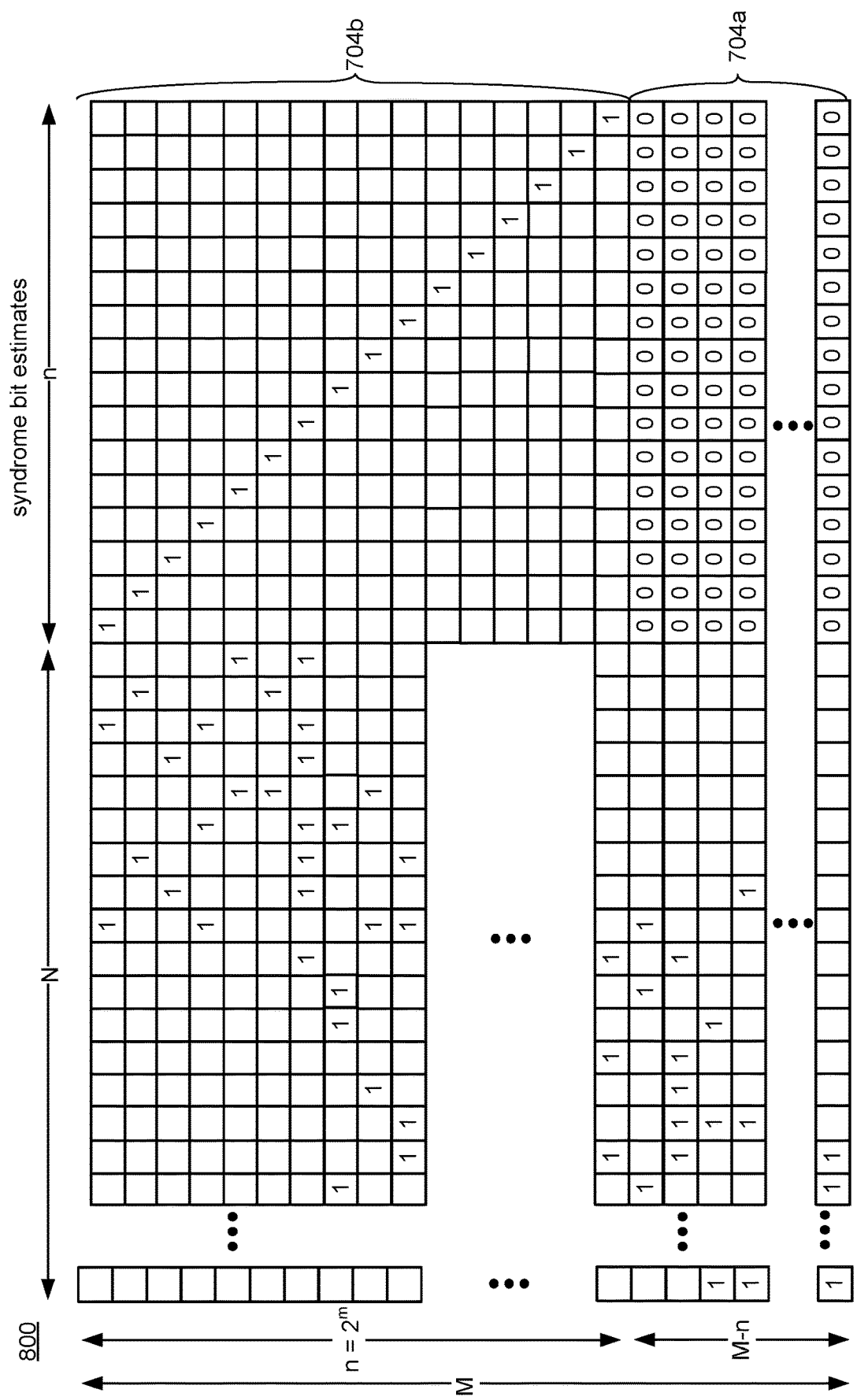
FIG. 8 depicts one embodiment of an LDPC decoder matrix corresponding to the sparse bipartite graph of FIG. 7.

FIG. 8 depicts one embodiment of an LDPC decoder matrix 800 corresponding to the sparse bipartite graph 700. The LDPC decoder matrix 800 is similar to the sparse parity check matrix H in FIG. 6, but has "n" columns for the punctured variable node ("vp"). The LDPC decoder matrix 800 has an n×n identity matrix corresponding to the punctured check nodes 704b and the punctured variable node 702b. The LDPC decoder matrix 800 has zero matrix corresponding to the non-punctured check nodes 704a and the punctured variable node 702b. Syndrome bit estimates are computed based on the LDPC decoder matrix 800, in one embodiment. The syndrome bit estimates are soft bit estimates, in one embodiment. The syndrome bit estimates are hard bit estimates, in one embodiment. In the example of FIG. 8, n is 16. However, n may be greater or less than 16. In some embodiments, n is a power of 2. In other embodiments n is not a power of 2. In some embodiment, n corresponds to the length of the constituent code represented by the punctured variable node. In one embodiment it is desired that the constituent code will have an efficient encoding and MAP decoding algorithm. Code families such as Hamming, Extended Hamming, Simplex and $1^{st}$ order Reed Muller have efficient encoding and MAP decoding algorithms due to their underlying recursive structure. For Extended Hamming and $1^{st}$ order Reed Muller codes, the code length n is a power of 2. For Hamming and Simplex codes, the code length is of the form $n=2^m-1$, for some integer m.

The examples of FIGS. 6-8 are somewhat simplified for purpose of illustration. As noted above, some of the variable nodes, some of the check nodes, and some edges are not depicted so as to simplify the diagrams. In some embodiments, a different degree of check is used for the punctured checks than for the non-punctured checks. The punctured checks may be nosier than the non-punctured checks because the syndrome for the punctured checks is unknown, in some embodiments. However, the syndrome for the punctured checks should be a valid codeword of the constituent code. For example, the syndrome for the punctured checks should be a valid codeword of a Simplex code, a Hamming code, an eHamming code, a Reed-Muller code, etc. In order to produce a relatively reliable estimate for the syndrome decoder 274b, the punctured check degree is kept low in some embodiments. The non-punctured checks are more reliable, as their syndrome is known to be zero, in some embodiments. In some embodiments, the punctured check degree is lower than the non-punctured check degree. An example for the punctured check degree is seven, and for the non-punctured check degree to be about 65 to 66. The punctured check degree can be higher or lower than seven. The non-punctured check degree may be lower than 65 or higher than 66.

Figure 9:
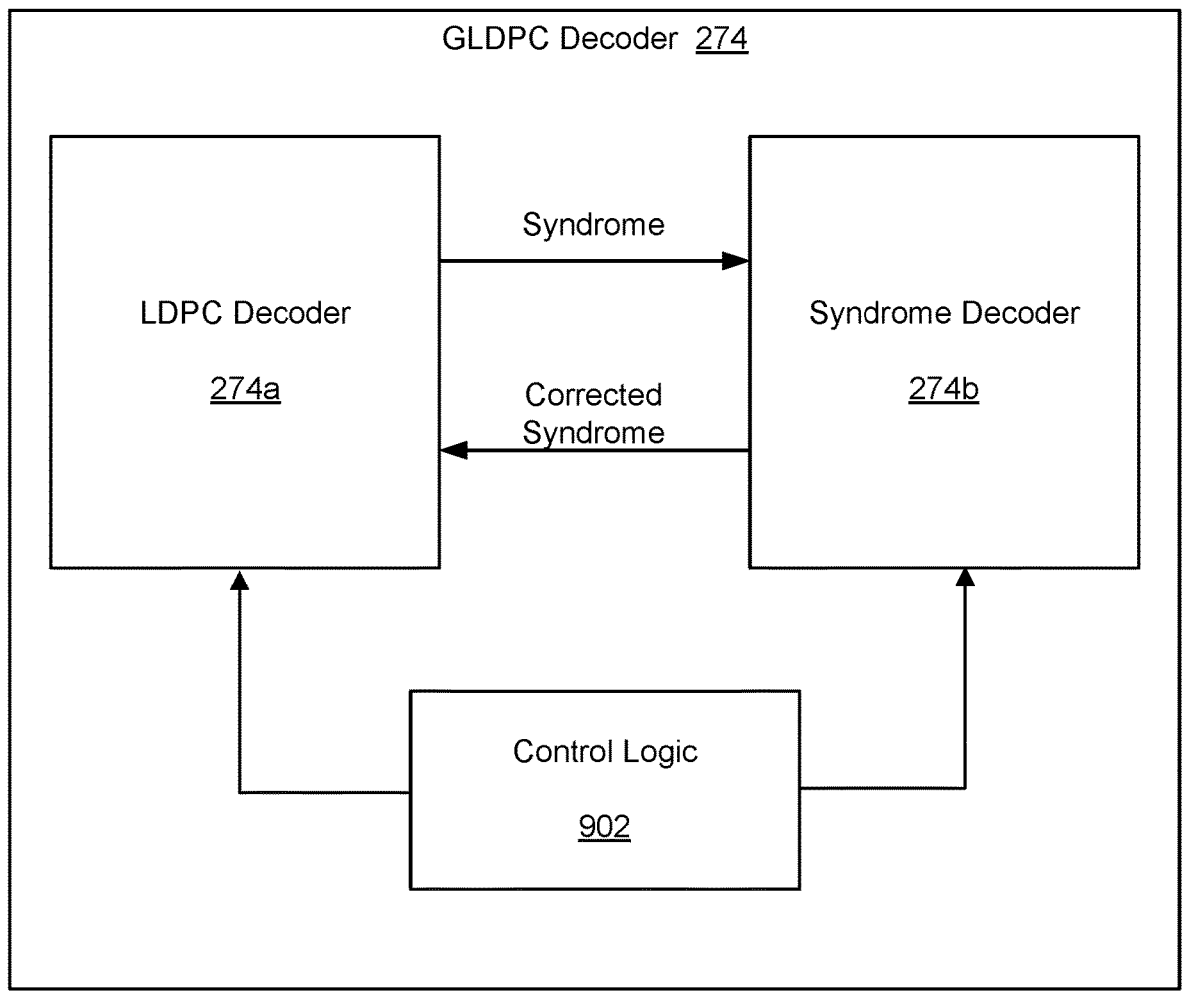
FIG. 9 depicts one embodiment of a GLDPC decoder.

FIG. 9 depicts one embodiment of a GLDPC decoder 274. The GLDPC decoder 274 includes an LDPC decoder 274a, a syndrome decoder 274b, and control logic 902. The LDPC decoder 274a and the syndrome decoder 274b are soft decoders, in one embodiment. The LDPC decoder 274a and the syndrome decoder 274b are hard decoders, in one embodiment. The GLDPC decoder 274 decodes based on a bipartite graph, in one embodiment. Reference will be made to the bipartite graph 700 of FIG. 7 for the sake of illustration. The GLDPC decoder 274 inputs encoded data and outputs a decoded version of the encoded data, in one embodiment.

The LDPC decoder 274a is configured to iterate between the variable nodes 702 and the check nodes 704 to estimate values for the variable nodes 702, in one embodiment. In one embodiment, the LDPC decoder 274a initially iterates between the non-punctured check nodes 704a and non-punctured variable nodes 702a to form initial bit estimates, in one embodiment. Based on the initial bit estimates, the LDPC decoder computes a syndrome of the punctured check nodes 704b, in one embodiment. The syndrome is a soft syndrome in one embodiment. The syndrome is a hard syndrome in one embodiment.

The syndrome is provided to the syndrome decoder 274b, which decodes the syndrome. The syndrome decoder 274b decodes the syndrome using a Hamming decoder, in one embodiment. The syndrome decoder 274b decodes the syndrome using an extended Hamming (or "eHamming") decoder, in one embodiment. The syndrome decoder 274b decodes the syndrome using a Simplex decoder, in one embodiment. The syndrome decoder 274b decodes the syndrome using a Reed-Muller decoder, in one embodiment. The syndrome decoder 274b decodes the syndrome using a first order Reed-Muller decoder, in one embodiment. The syndrome decoder 274b provides a corrected syndrome to the LDPC decoder 274a.

The control logic 902 is configured to control operation of the LDPC decoder 274a and the syndrome decoder 274b, in one embodiment. The control logic 902 provides encoded data to the LDPC decoder 274a, in one embodiment. The control logic 902 instructs the LDPC decoder 274a to make an initial estimate of the syndrome, in one embodiment. The control logic 902 instructs the syndrome decoder 274b to decode and/or correct the syndrome, in one embodiment. The control logic 902 instructs the LDPC decoder 274a to update the bit estimates based on the corrected syndrome, in one embodiment. The control logic 902 is configured to provide a decoded version of encoded data based on final bit estimates from the LDPC decoder 274a, in one embodiment. The control logic may be separate from the LDPC decoder 274a and syndrome decoder 274b, or may be incorporating into one or both of the LDPC decoder 274a and the syndrome decoder 274b. The control logic 902 may also be referred to as a control circuit.

The LDPC decoder 274a, the syndrome decoder 274b, and the control logic 902 are dedicated hardware circuits, known as hardware accelerators, in one embodiment. In other embodiments, the LDPC decoder 274a, the syndrome decoder 274b, and the control logic 902 can be implemented in software.

Figure 10:
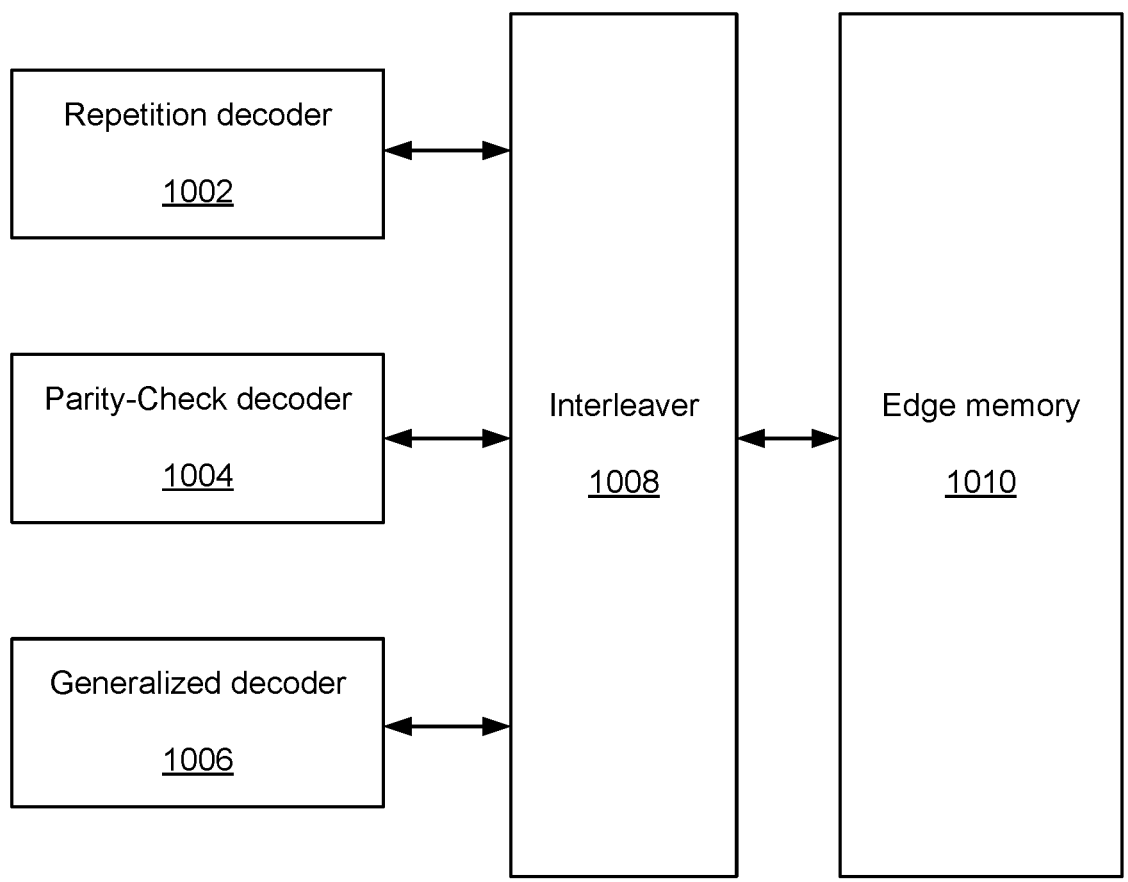
FIG. 10 depicts another embodiment of a GLDPC decoder.

FIG. 10 depicts one embodiment of a GLDPC decoder 274. The GLDPC decoder 274 includes a repetition decoder 1002, a parity check decoder 1004, a generalized decoder 1006, an interleaver 1008, and edge memory 1010. Each of the decoders is a maximum a-posteriori (MAP) decoder, in one embodiment. In one embodiment, the repetition decoder 1002 and the parity check decoder 1004 are implemented by LDPC decoder 274a. In one embodiment, the generalized decoder 1006 is implemented by syndrome decoder 274b. The generalized decoder 1006 comprises a non-repeating linear block code decoder, in some embodiments. Examples of generalized decoders 1006 include, but are not limited to, Simplex decoders, Hamming decoders, eHamming decoders, and Reed Muller decoders (e.g., first order Reed Muller decoders).

The interleaver 1008 is based on the sparse bipartite graph, in one embodiment. The interleaver 1008 is configured to control the passing of messages between variable nodes 702 and check nodes 704, in one embodiment. The interleaver 1008 is configured to store results of message passing computations in the edge memory 1010, in some embodiments.

The edge memory 1010 is used to stored results of passing messages between variable nodes 702 and check nodes 704 of the sparse bipartite graph, in one embodiment. The edge memory 1010 may be used to pass information between variable nodes 702 and check nodes 704. For example, after performing a computation such as in Equation 6, 7, or 8, results of the computation may be stored in the edge memory 1010. The edge memory 1010 may be used to pass an initial value for the syndrome from the LDPC decoder 274a to the syndrome decoder 274b. The edge memory 1010 may be used to pass the corrected syndrome from the syndrome decoder 274b to the LDPC decoder 274a.

Figure 11:
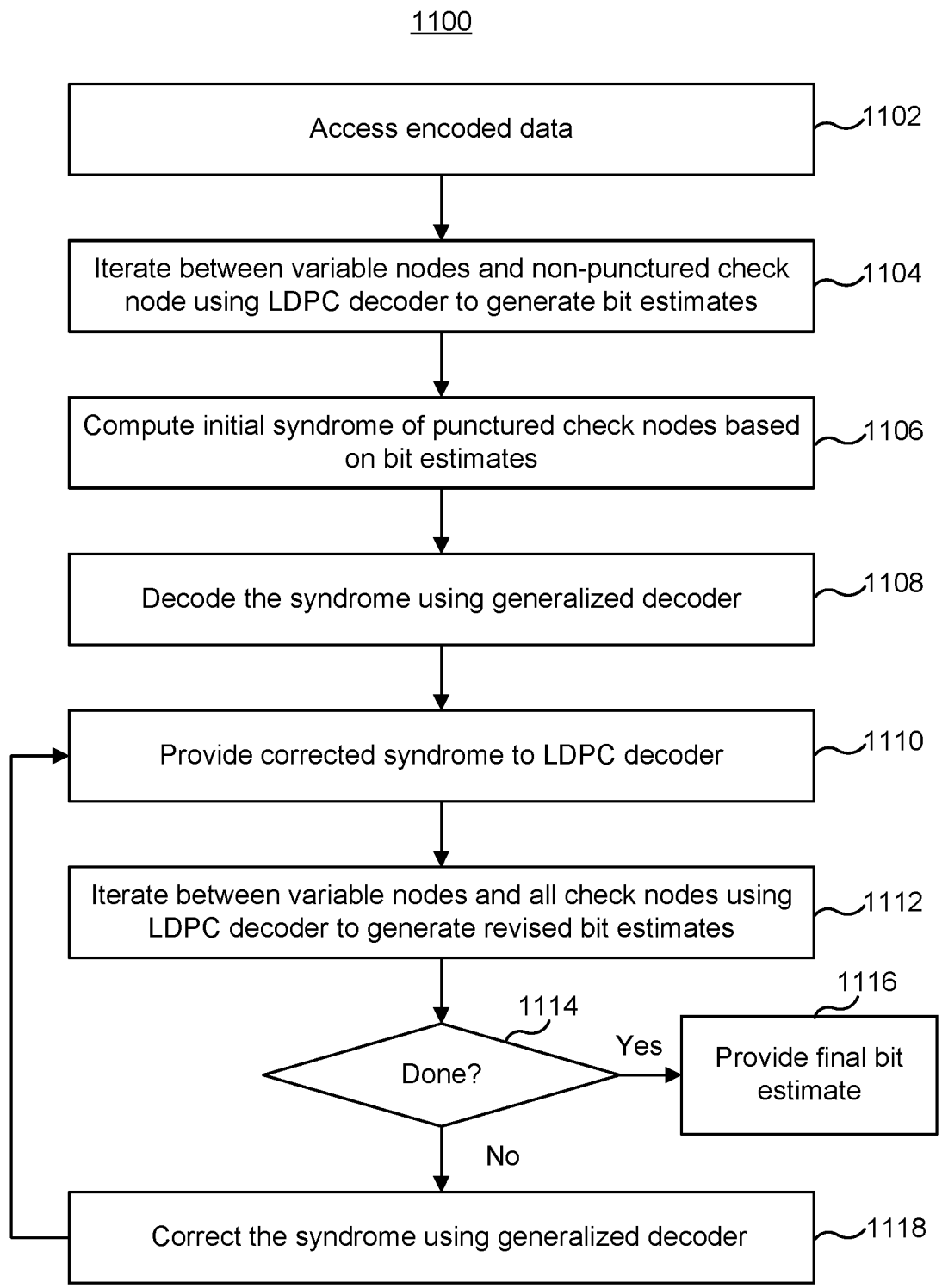
FIG. 11 is a flowchart of one embodiment of a process of decoding data using a GLDPC decoder.

FIG. 11 is a flowchart of one embodiment of a process 1100 of decoding data using a GLDPC decoder 274. Process 1100 is performed by the GLDPC decoder 274 of FIG. 9, in one embodiment. Process 1100 is performed by the GLDPC decoder 274 of FIG. 10, in one embodiment.

Step 1102 includes accessing encoded data. The data was encoded using a GLDPC encoder 276, in one embodiment. In one embodiment, the encoded data is accessed from memory structure 326. For example, BEP 112 may access the encoded data from a memory package 104. However, the encoded data could be received over any type of communication channel. The data is provided to the LDPC decoder 274a, in one embodiment.

Step 1104 includes the LDPC decoder 274a iterating between non-punctured variable nodes 702a and non-punctured check nodes 704a. Step 1104 results in an initial estimate of bits of the codeword, in one embodiment. With reference to FIG. 7, the non-punctured check nodes 704a do not necessarily have edges 706 to all of the non-punctured variable nodes 702a. Thus, step 1104 does not necessarily involve all of the non-punctured variable nodes 702a. However, in other embodiments, step 1104 may involve all of the non-punctured variable nodes 702a.

Step 1104 includes performing message passing computations, in one embodiment. Referring to the example bipartite graph 700 of FIG. 7, a message passing computation may be performed for each edge 706 between a non-punctured variable node 702a and a non-punctured check node 704a. Step 1104 may include performing variable node to check node computations, as well as check node to variable node computations. In one embodiment, Equation 6 is used for variable node to check node computations. In one embodiment, Equation 7 is used for check node to variable node computations. In one embodiment, Equation 8 is used to make an initial estimation of the variable nodes. Step 1104 may be used to reduce the bit error rate of the non-punctured variable nodes 702a.

Step 1106 includes computing an initial value for the syndrome of punctured check nodes 704b based on the initial bit estimates. Step 1106 includes making an initial estimate of a code (e.g., eHamming code) at the edge of the punctured bit line 702b, in one embodiment. Step 1106 may include passing information from non-punctured variable nodes 702a to the punctured check nodes 704b. Step 1106 may include passing information from the punctured check nodes 704b to the punctured variable node 702b. The initial value of the syndrome is provided to the syndrome decoder 274b, in one embodiment. In one embodiment, the initial syndrome is stored in the edge memory 1010 in order to provide the initial syndrome is provided to the syndrome decoder 274b.

Step 1108 includes decoding the syndrome of the punctured check nodes 704b. Step 1108 is performed by the syndrome decoder 274b, in one embodiment. The syndrome decoder 274b corrects the syndrome based on knowledge that the syndrome at the punctured check node 702b should be a valid code word of the generalized constitute code (e.g., an eHamming code). Step 1108 results in what is referred to herein as a "corrected syndrome." In one embodiment, the syndrome decoder 274b corrects the syndrome by determining the closest valid codeword to the present syndrome. In one embodiment, the syndrome is decoded based on selected rows of matrix 800 (see FIG. 8). For example, the rows corresponding to the punctured check nodes 704b may be used.

Step 1110 includes providing the corrected syndrome to the LDPC decoder 274a. Stated another way, a corrected value of the bits at the punctured variable node 702b are provided to the LDPC decoder 274a. In one embodiment, the corrected syndrome is stored in the edge memory 1010 in order to provide the corrected syndrome to the LDPC decoder 274a.

Step 1112 includes the LDPC decoder 274a iterating between all of the variable nodes 702 and all of the check nodes 704, in one embodiment. Step 1112 results in an updated estimate of the bits of the codeword, in one embodiment.

Step 1112 includes performing message passing computations, in one embodiment. Referring to the example bipartite graph 700 of FIG. 7, a message passing computation may be performed for each edge 706. That is, a message passing computation may be performed for the edges 706 between each variable node 702 and each check node 704. Step 1112 may include performing variable node to check node computations, as well as check node to variable node computations. In one embodiment, Equation 6 is used for variable node to check node computations. In one embodiment, Equation 7 is used for check node to variable node computations. In one embodiment, Equation 8 is used to update the estimation of the variable nodes.

Step 1114 includes a determination of whether the process is complete. This step may include determining whether the updated estimate of the variable nodes may serve as a final estimate. If so, step 1116 is performed. Step 1116 includes providing a final bit estimate. This is based on the last bit estimate from the LDPC decoder 274a. This serves as the output of the GLDPC decoder 274.

If the process is not yet complete, then step 1118 is performed. Step 1118 includes correcting the syndrome. Step 1118 is performed by the syndrome decoder 274b, in one embodiment. The updated (or corrected) syndrome is provided to the LDPC decoder 274a in step 1110. The LDPC decoder 274a iterates between the variable nodes and check nodes again (using the corrected syndrome), in step 1112. The process continued until it is determined (in step 1114) that a final estimate of the bits has been determined.

Process 1100 results in a lower bit error rate than if the punctured variable node based on the generalized constituent code were not used. Moreover, the code rate is kept at a desirable level because the bits for the punctured variable node are not transmitted and/or stored in memory structure 326. In other words, embodiments of a GLDPC decoder 274 have a lower bit error rate than an LDPC decoder having the same code rate.

Figure 12:
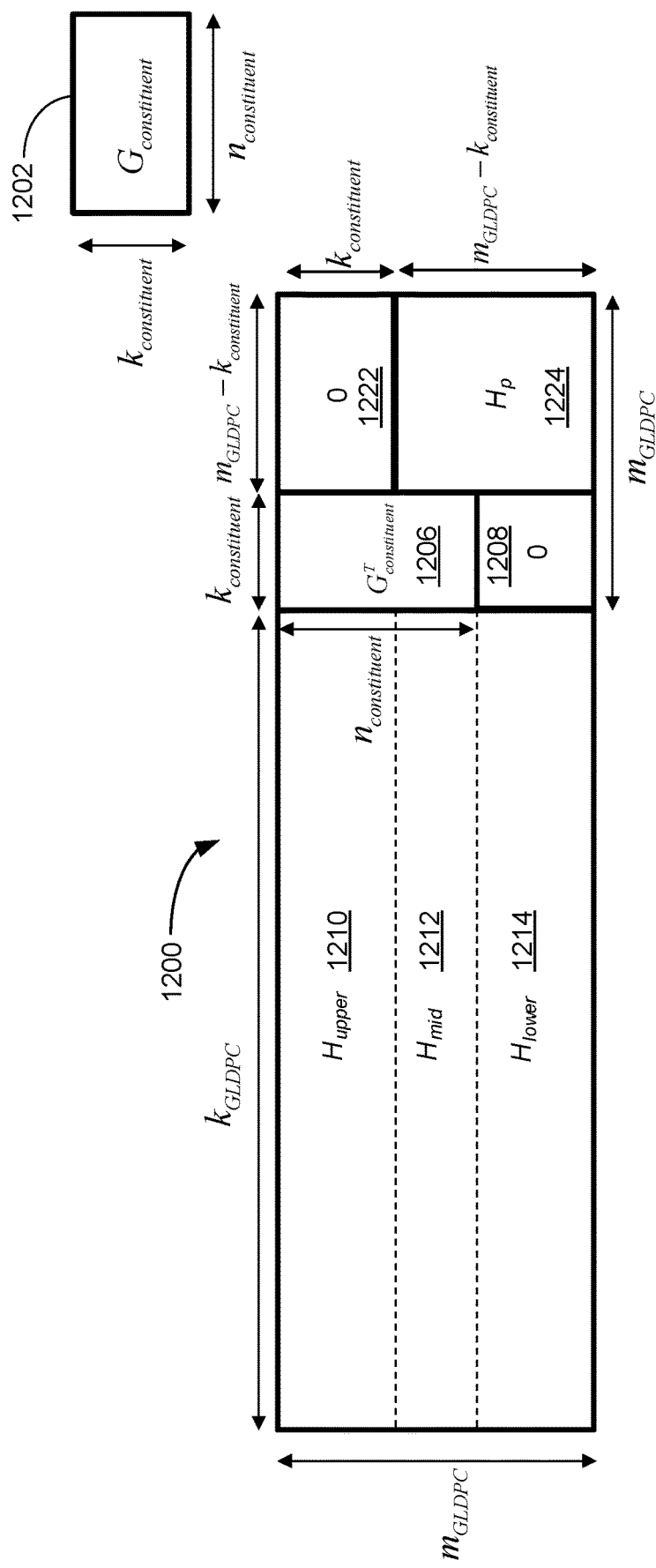
FIG. 12 depicts one embodiment of a GLDPC matrix for encoding data.

FIG. 12 depicts one embodiment of a GLDPC matrix for encoding 1200, and a constituent code generator matrix ($G_{constituent}$) 1202. In the example of FIG. 12, the code rate is 8/9. The punctured GLDPC code is based on a (11, 6) eHamming constituent code, in one embodiment. The constituent code generator matrix 1202 has "$k_{constituent}$" rows and "$n_{constituent}$" columns, in this example. In one embodiment, $k_{constituent}$ is 11 and $n_{constituent}$ is 16. As is known in the art, the rows of a generator matrix may form the basis for a linear block code. In one embodiment, the valid codewords comprise all of the linear combinations of the rows of the constituent code generator matrix 1202. The transpose ($G^T_{constituent}$) 1206 of the constituent code generator matrix is contained in the GLDPC matrix for encoding 1200. The generator matrix ($G_{constituent}$) 1202 may be, for example, a Hamming code generator matrix, an eHamming code generator matrix, a Simplex code generator matrix, a first order Reed Muller generator matrix.

The GLDPC matrix for encoding 1200 has "$m_{GLDPC}$" rows. In one embodiment, $m_{GLDPC}$ is 27. The columns of GLDPC matrix for encoding 1200 are divided into three sections. There are $k_{GLDPC}$ columns, which correspond to the data bits of the codeword, in one embodiment. In one embodiment, $k_{GLDPC}$ is 128. There are $k_{constituent}$ columns, which correspond to the punctured bits of the codeword, in one embodiment. There are $m_{GLDPC}$-$k_{constituent}$ columns, which correspond to the non-punctured bits of the codeword, in one embodiment.

Referring now to the $k_{GLDPC}$ columns, those rows are divided into $H_{upper}$ 1210, $H_{mid}$ 1212, and $H_{lower}$ 1214. $H_{upper}$ 1210 has $k_{constituent}$ rows. Combined, $H_{upper}$ 1210 and $H_{mid}$ 1212 have $n_{constituent}$ rows. Combined, $H_{mid}$ 1212 and $H_{lower}$ 1214 and have $m_{GLDPC}$-$k_{constituent}$ rows.

Referring now to the $k_{constituent}$ columns, those rows are divided into $G^T_{constituent}$ 1206 and a zero matrix 1208.

Referring now to the $m_{GLDPC}$-$k_{constituent}$ columns, those rows are divided into a zero matrix 1222 and an $H_p$ matrix 1224. That zero matrix 1222 has $k_{constituent}$ rows. The $H_p$ matrix 1224 has $m_{GLDPC}$-$k_{constituent}$ rows. The $H_p$ matrix 1224 is a lower triangular matrix, in one embodiment. A lower triangular matrix structure may simplify encoding. Other matrices can be used for the $H_p$ matrix 1224.

Figure 13:
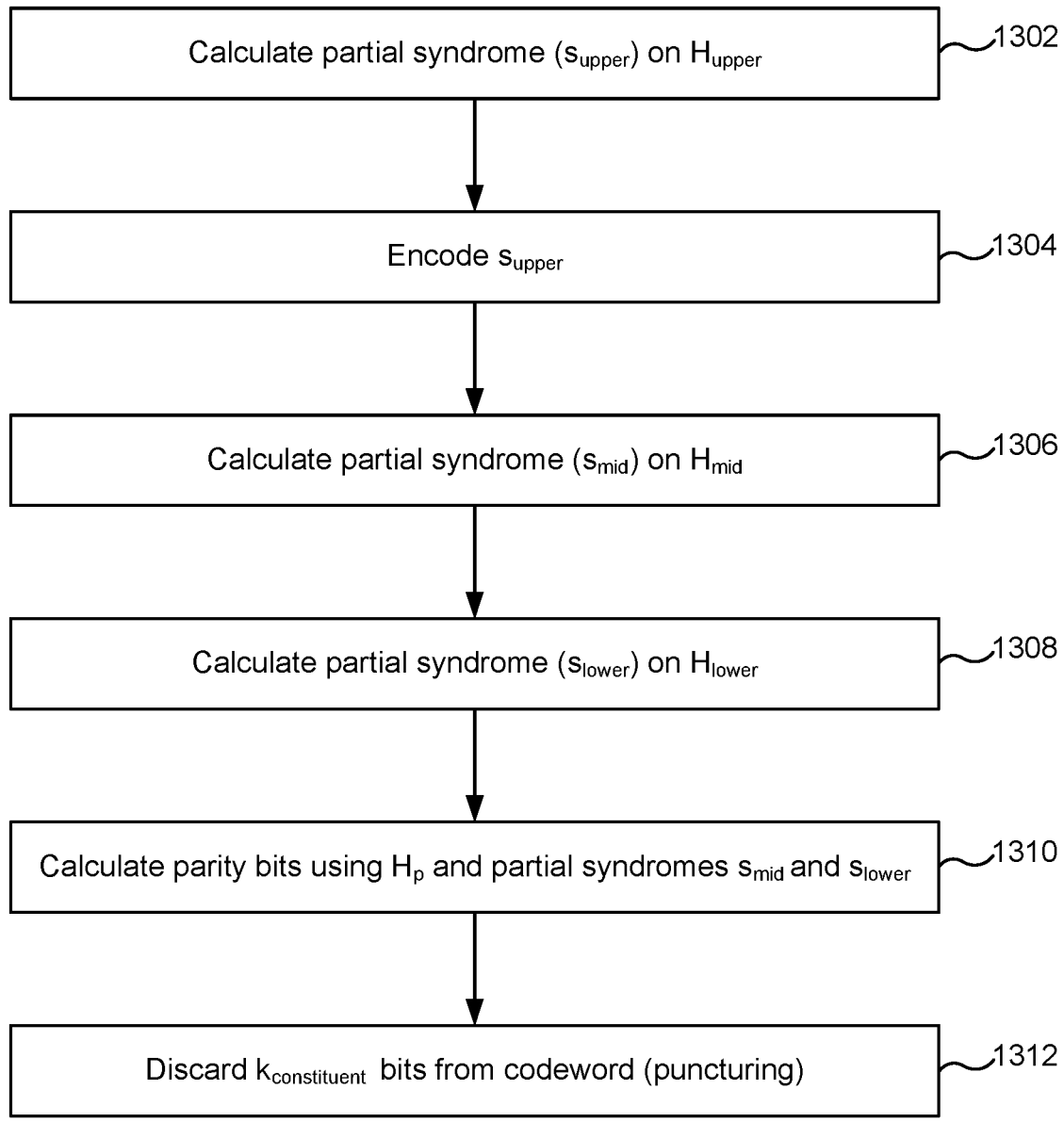
FIG. 13 is a flowchart of one embodiment of a process of encoding data using a GLDPC encoder.

FIG. 13 is a flowchart of one embodiment of a process 1300 of encoding data using a GLDPC encoder. Process 1300 will be described with reference to the GLDPC matrix for encoding 1200 of FIG. 12. Process 1300 is performed by GLDPC encoder 276, in one embodiment.

Step 1302 includes calculating a partial syndrome ($s_{upper}$) on $H_{upper}$ 1210. In one embodiment, Equation (Eq.) 9 is used, where "d" is the data for encoding.

$$s_{upper} = H_{upper} * d \qquad (Eq.\ 9)$$

Step 1304 includes encoding $s_{upper}$. The encoding is based on a generalized constituent code, in some embodiments. In one embodiment, Equation 10 is used to encode $s_{upper}$.

$$s_{constituent} = \text{Encode}(s_{upper}) \qquad (Eq.\ 10)$$

In one embodiment, the encoding in Equation 10 is Hamming encoding. In one embodiment, the encoding in Equation 10 is eHamming encoding. In one embodiment, the encoding in Equation 10 is Simplex encoding. In one embodiment, the encoding in Equation 10 is Reed Muller encoding.

Step 1306 includes calculating a partial syndrome ($s_{mid}$) on $H_{mid}$ 1212. In one embodiment, Equation 11 is used, where "d" is the data for encoding.

$$s_{mid} = H_{mid} * d + s_{constituent} \qquad (Eq.\ 11)$$

Step 1308 includes calculating a partial syndrome ($s_{lower}$) on $H_{lower}$ 1214. In one embodiment, Equation 12 is used, where "d" is the data for encoding.

$$s_{lower} = H_{lower} * d \qquad (Eq.\ 12)$$

Step 1310 includes calculating parity bits using the $H_p$ matrix 1224 and partial syndromes $s_{mid}$ and $s_{lower}$. In one embodiment, Equation 13 is used, where "p" is the codeword parity. In one embodiment, $H_p$ is lower triangular and back substitution is performed in step 1310.

$$H_p \cdot p = \begin{bmatrix} s_{mid} \\ s_{lower} \end{bmatrix} \qquad (Eq.\ 13)$$

Step 1312 includes discarding bits from the codeword, which is referred to as puncturing. In one embodiment, $k_{constituent}$ bits are discarded from the codeword. After the $k_{constituent}$ bits are discarded from the codeword, the codeword is stored in memory structure 326, in one embodiment.

Figure 14:
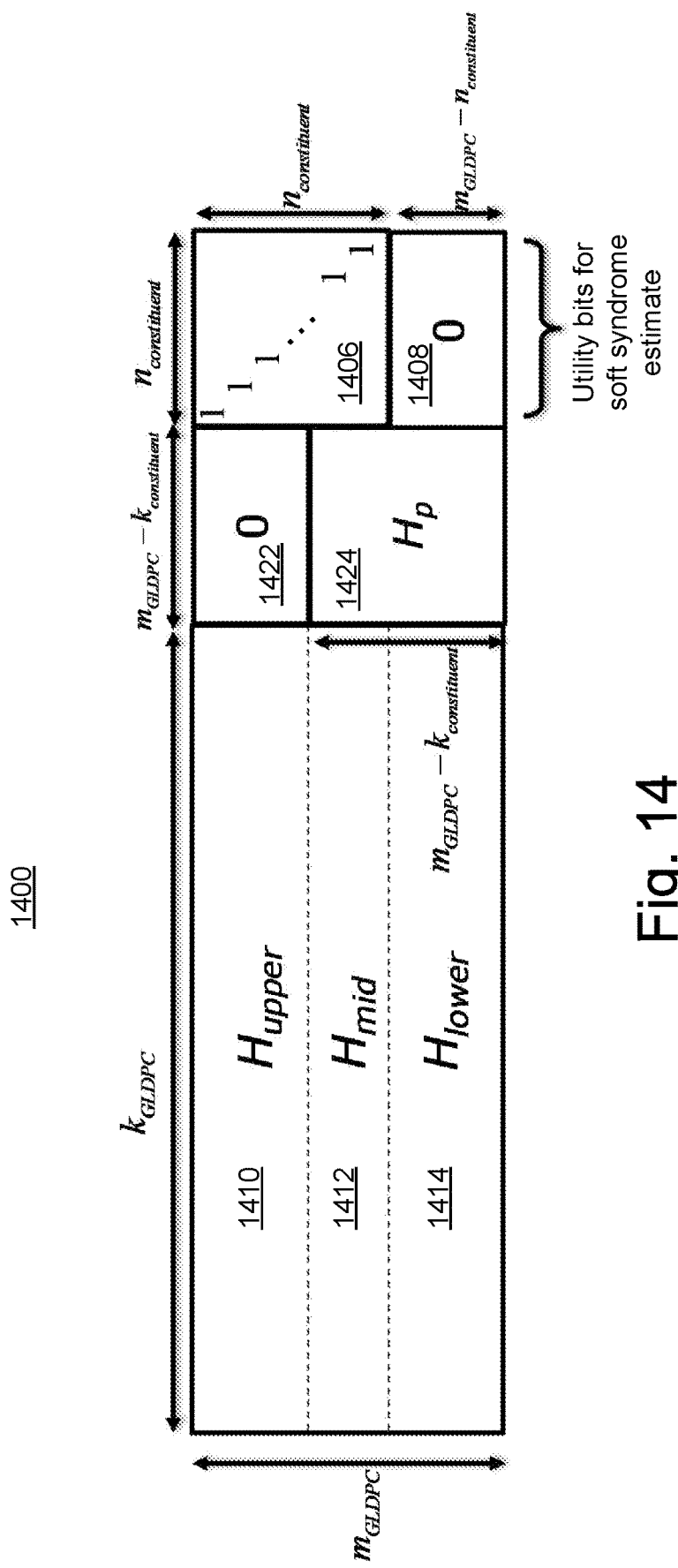
FIG. 14 depicts one embodiment of a GLDPC matrix for decoding.

FIG. 14 depicts one embodiment of a GLDPC matrix for decoding 1400. The GLDPC matrix for decoding 1400 may be used when the GLDPC matrix for encoding 1200 is used to encoded the data. In the example of FIG. 14, the code rate is 8/9. The punctured GLDPC code is based on a (11, 6) eHamming constituent code, in one embodiment. The GLDPC matrix for decoding 1400 is used in one embodiment of process 1100.

The GLDPC matrix for decoding 1400 has "$m_{GLDPC}$" rows. In one embodiment, $m_{GLDPC}$ is 27. The columns of GLDPC matrix for encoding 1400 are divided into three sections. There are $k_{GLDPC}$ columns, which correspond to the data bits of the codeword, in one embodiment. In one embodiment, $k_{GLDPC}$ is 128. There are $m_{GLDPC}\text{-}k_{constituent}$ columns, which correspond to the non-punctured bits of the codeword, in one embodiment. These $m_{GLDPC}\text{-}k_{constituent}$ columns correspond to parity bits, in one embodiment. There are $k_{constituent}$ columns, which correspond to the punctured bits of the codeword, in one embodiment.

Referring now to the $k_{GLDPC}$ columns, those rows are divided into $H_{upper}$ 1410, $H_{mid}$ 1412, and $H_{lower}$ 1414. $H_{upper}$ 1410 has $k_{constituent}$ rows. Combined, $H_{upper}$ 1410 and $H_{mid}$ 1412 have $n_{constituent}$ rows. Combined, $H_{mid}$ 1412 and $H_{lower}$ 1414 and have $m_{GLDPC}\text{-}k_{constituent}$ rows. $H_{lower}$ 1414 has $m_{GLDPC}\text{-}n_{constituent}$ rows.

Referring now to the $m_{GLDPC}\text{-}k_{constituent}$ columns, the rows are divided into a zero matrix 1422 and an $H_p$ matrix 1424. That zero matrix 1422 has $k_{constituent}$ rows. The $H_p$ matrix 1224 has $m_{GLDPC}\text{-}k_{constituent}$ rows. The $H_p$ matrix 1424 is a lower triangular matrix, in one embodiment. Other matrices can be used for the $H_p$ matrix 1424.

Referring now to the $n_{constituent}$ columns, the rows are divided into an identity matrix 1406 and a zero matrix 1408. The identity matrix 1406 includes $n_{constituent}$ rows and $n_{constituent}$ columns. The zero matrix 1408 includes $m_{GLDPC}\text{-}n_{constituent}$ rows and $n_{constituent}$ columns. In one embodiment, an estimate of the soft syndrome of the punctured check nodes 704b may be made based on "utility" bits, as indicted in FIG. 14. Referring again to step 1106 in FIG. 11, an initial syndrome of the punctured check nodes is made based on bit estimates, in one embodiment. The utility bits may be used in one embodiment of step 1106.

A first embodiment includes an apparatus, comprising a generalized low-density parity-check (GLDPC) decoder comprising a low-density parity-check (LDPC) decoder and a syndrome decoder. The LDPC decoder is configured to generate a codeword for encoded data. The syndrome decoder is configured to decode a syndrome of punctured check nodes based on a linear block code having more than one information bit. The GLDPC decoder is configured to control the LDPC decoder to compute an initial value of the syndrome of the punctured check nodes based on an initial estimate of the codeword from the LDPC decoder. The GLDPC decoder is configured to alternate between controlling the syndrome decoder to correct the syndrome and controlling the LDPC decoder to update the codeword based on the corrected syndrome. The GLDPC decoder is configured to provide a decoded version of the encoded data based on a final estimate of the codeword.

In accordance with a second embodiment and in furtherance of the first embodiment, the LDPC decoder is configured to iterate between non-punctured variable nodes and non-punctured check nodes to generate initial bit estimates for the initial estimate of the codeword.

In accordance with a third embodiment and in furtherance of either the first or the second embodiment, the punctured check nodes have a lower check degree than the non-punctured check nodes.

In accordance with a fourth embodiment and in furtherance of either the second or third embodiment, the LDPC decoder is configured to iterate between a first set of nodes that comprises the non-punctured variable nodes and a punctured variable node that corresponds to the punctured check nodes and a second set that comprises the punctured check nodes and the non-punctured check nodes to update the codeword.

In accordance with a fifth embodiment and in furtherance of any of the first to fourth embodiments, the syndrome decoder comprises one or more of a Hamming decoder, and extended Hamming (eHamming) decoder, a Simplex decoder, or a Reed Muller decoder.

In accordance with a sixth embodiment and in furtherance of any of the first to fifth embodiments, the syndrome decoder comprises a soft syndrome decoder.

In accordance with a seventh embodiment and in furtherance of any of the first to sixth embodiments, the punctured check nodes each have an edge in a bipartite graph to the linear block code at a punctured variable node in the bipartite graph.

In accordance with an eighth embodiment and in furtherance of any of the first to seventh embodiments, the apparatus further comprises non-volatile memory cells, and a data path controller configured to access the encoded data from the non-volatile memory cells.

Another embodiment includes a method comprising iterating between non-punctured variable nodes and non-punctured check nodes of a bipartite graph using a low-density parity-check (LDPC) decoder to generate initial soft bit estimates for encoded data. The method includes generating an initial estimate for a soft syndrome for punctured check nodes of the bipartite graph based on the initial soft bit estimates. The punctured check nodes have edges in the bipartite graph to a punctured variable node based on a non-trivial linear block code. The method includes correcting the soft syndrome using a soft syndrome decoder based on the non-trivial linear block code. The method includes alternating between using the LDPC decoder to update the soft bit estimates based on the corrected soft syndrome and using the soft syndrome decoder to correct the soft syndrome. The method includes outputting a decoded version of the encoded data based on final soft bit estimates from the LDPC decoder.

Still another embodiment includes a non-volatile storage device comprising non-volatile memory cells; a low-density parity-check (LDPC) decoder, a non-repeating linear block code decoder, and a control circuit. The LDPC decoder is configured to iterate between variable nodes and parity check nodes to generate bit estimates for the variable nodes. The variable nodes comprise a punctured variable node and non-punctured variable nodes. The parity check nodes comprise non-punctured check nodes and punctured check nodes that correspond to the punctured variable node. The punctured variable node is based on a non-repeating linear block code. The non-repeating linear block code decoder is configured to correct the non-repeating linear block code at the punctured variable node. The control circuit is configured to instruct the LDPC decoder to iterate between the non-punctured variable nodes and the non-punctured check nodes to generate initial bit estimates for the variable nodes. The control circuit is configured to compute an initial value for a non-repeating linear block code at the punctured variable node based on the initial bit estimates for the variable nodes. The control circuit is configured to alternate between controlling the non-repeating linear block code decoder to correct the value for the non-repeating linear block code and controlling the LDPC decoder to update the bit estimates for the variable nodes. The control circuit is configured to provide decoded data based on final bit estimates for the variable nodes from the LDPC decoder.

Corresponding methods, systems and computer- or processor-readable storage devices which have executable code for performing the methods provided herein may also be provided.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a generalized low-density parity-check (GLDPC) decoder comprising a low-density parity-check (LDPC) decoder and a syndrome decoder;
the LDPC decoder configured to generate a codeword for encoded data;
the syndrome decoder configured to decode a syndrome of punctured check nodes based on a linear block code having more than one information bit; and
the GLDPC decoder configured to:
control the LDPC decoder to compute an initial value of the syndrome of the punctured check nodes based on an initial estimate of the codeword from the LDPC decoder;
alternate between controlling the syndrome decoder to correct the syndrome and controlling the LDPC decoder to update the codeword based on the corrected syndrome; and
provide a decoded version of the encoded data based on a final estimate of the codeword.

2. The apparatus of claim 1, wherein the LDPC decoder is configured to iterate between non-punctured variable nodes and non-punctured check nodes to generate initial bit estimates for the initial estimate of the codeword.

3. The apparatus of claim 2, wherein the punctured check nodes have a lower check degree than the non-punctured check nodes.

4. The apparatus of claim 2, wherein the LDPC decoder is configured to iterate between a first set of nodes that comprises the non-punctured variable nodes and a punctured variable node that corresponds to the punctured check nodes and a second set of nodes that comprises the punctured check nodes and the non-punctured check nodes to update the codeword.

5. The apparatus of claim 1, wherein the syndrome decoder comprises one or more of a Hamming decoder, and extended Hamming (eHamming) decoder, a Simplex decoder, or a Reed Muller decoder.

6. The apparatus of claim 1, wherein the syndrome decoder comprises a soft syndrome decoder.

7. The apparatus of claim 1, wherein the punctured check nodes each have an edge in a bipartite graph to the linear block code at a punctured variable node in the bipartite graph.

8. The apparatus of claim 1, further comprising:
non-volatile memory cells; and
a data path controller configured to access the encoded data from the non-volatile memory cells.

9. A method comprising:
iterating between non-punctured variable nodes and non-punctured check nodes of a bipartite graph using a low-density parity-check (LDPC) decoder to generate initial soft bit estimates for encoded data;
generating an initial estimate for a soft syndrome for punctured check nodes of the bipartite graph based on the initial soft bit estimates, the punctured check nodes have edges in the bipartite graph to a punctured variable node based on a non-trivial linear block code;
correcting the soft syndrome using a soft syndrome decoder based on the non-trivial linear block code;

alternating between using the LDPC decoder to update the soft bit estimates based on the corrected soft syndrome and using the soft syndrome decoder to correct the soft syndrome; and outputting a decoded version of the encoded data based on final soft bit estimates from the LDPC decoder.

10. The method of claim 9, wherein generating the initial estimate for the soft syndrome comprises:

passing information based on the initial soft bit estimates from the non-punctured variable nodes to the punctured check nodes; and passing information from the punctured check nodes to the punctured variable node.

11. The method of claim 9, wherein using the LDPC decoder to update the soft bit estimates based on the corrected soft syndrome comprises:

iterating a set of variable nodes that comprises the punctured variable node and the non-punctured variable nodes and a set of parity check nodes that comprise the punctured check nodes and the non-punctured check nodes to update the soft bit estimates based on the corrected soft syndrome.

12. The method of claim 11, wherein:

the constituent codes for the non-punctured variable nodes are based on a repetition code; and the non-trivial linear block code for the punctured variable node has more than one information bit.

13. The method of claim 9, wherein correcting the soft syndrome using the soft syndrome decoder comprises:

using one or more of a Hamming decoder, an extended Hamming (eHamming) decoder, a Simplex decoder, or a Reed Muller decoder to decode the soft syndrome.

14. The method of claim 9, further comprising:

encoding the data based in part on a constituent code generator matrix to generate a codeword;

discarding bits from the codeword to generate the encoded data;

storing the encoded data in non-volatile memory; and accessing the encoded data from the non-volatile memory.

15. A non-volatile storage device comprising:

non-volatile memory cells;

a low-density parity-check (LDPC) decoder configured to iterate between variable nodes and parity check nodes to generate bit estimates for the variable nodes, the variable nodes comprise a punctured variable node and non-punctured variable nodes, the parity check nodes comprising non-punctured check nodes and punctured check nodes that correspond to the punctured variable node, the punctured variable node based on a non-repeating linear block code;

a non-repeating linear block code decoder configured to correct the non-repeating linear block code at the punctured variable node; and a control circuit configured to:

instruct the LDPC decoder to iterate between the non-punctured variable nodes and the non-punctured check nodes to generate initial bit estimates for the variable nodes;

compute an initial value for a non-repeating linear block code at the punctured variable node based on the initial bit estimates for the variable nodes;

alternate between controlling the non-repeating linear block code decoder to correct the value for the non-repeating linear block code and controlling the LDPC decoder to update the bit estimates for the variable nodes; and provide decoded data based on final bit estimates for the variable nodes from the LDPC decoder.

16. The non-volatile storage device of claim 15, wherein the punctured check nodes have a lower check degree than the non-punctured check nodes.

17. The non-volatile storage device of claim 15, wherein to update the bit estimates for the variable nodes the LDPC decoder is configured to:

iterate between the variable nodes and the parity check nodes to update the bit estimates.

18. The non-volatile storage device of claim 15, further comprising:

a generalized low-density parity-check (GLDPC) encoder configured to:

encode data based in part on a constituent code generator matrix to generate a codeword, the transpose of the constituent code generator matrix having k columns; and discard k bits from the codeword to generate encoded data.

19. The non-volatile storage device of claim 15, wherein;

the non-repeating linear block code decoder comprises a soft decoder; and the LDPC decoder comprises a soft decoder configured to iterate between the variable nodes and the parity check nodes to generate soft bit estimates.

20. The non-volatile storage device of claim 15, wherein non-repeating linear block code comprises more than one information bit.

* * * * *